United States Patent [19]
Suzuki et al.

[11] Patent Number: 5,654,924
[45] Date of Patent: Aug. 5, 1997

[54] SEMICONDUCTOR MEMORY DEVICE CAPABLE OF OPERATING WITH POTENTIALS OF ADJACENT BIT LINES INVERTED DURING MULTI-BIT TEST

[75] Inventors: Tomio Suzuki; Motoko Hara; Shigeru Mori, all of Hyogo, Japan

[73] Assignee: Mitsubishi Denki Kabushiki Kaisha, Tokyo, Japan

[21] Appl. No.: 640,639

[22] Filed: May 1, 1996

[30] Foreign Application Priority Data

Aug. 29, 1995 [JP] Japan ..................... 7-220388

[51] Int. Cl.$^6$ ........................................ G11C 7/00
[52] U.S. Cl. ................. 365/189.05; 365/201; 365/233
[58] Field of Search ................. 365/189.05, 230.08, 365/201, 233

[56] References Cited

U.S. PATENT DOCUMENTS 5,151,881  9/1992  Kajigaya et al. ................... 365/233

FOREIGN PATENT DOCUMENTS 1-178199  7/1989  Japan .
3-37888   2/1991  Japan .
3-162800  7/1991  Japan .

*Primary Examiner*—Joseph A. Popek
*Attorney, Agent, or Firm*—Lowe, Price, LeBlanc & Becker

[57] ABSTRACT

A semiconductor memory device is provided which can apply a voltage stress to every adjacent bit lines even when data is written using a data bit compression function in a burn-in test mode. More specifically, when data is written using the data bit compression function in the test mode, an input buffer circuit is brought to a state in which it receives a signal corresponding to a signal dq0 applied to a specific input/output terminal by a switch circuit controlled by a test mode specify signal TE in common. When an inversion designate signal INV is in an active state, a complementary signal corresponding to a signal obtained by inversion of signal dq0 by an inverting circuit is output to internal data buses IO0, ZIO0, and IO2, ZIO2. On the other hand, a complementary signal corresponding to signal dq0 is output to internal data buses IO1, ZIO1, and IO3, ZIO3.

20 Claims, 19 Drawing Sheets

FIG.9A

WHEN INV="L"

| g0 | g2 | g1 | g3 | TM g0 |
|----|----|----|----|-------|
| 0 0 0 0 0 0 0 0 0 1 1 1 1 1 1 | 0 1 1 1 0 0 0 1 1 1 0 0 0 1 1 | 0 1 0 1 0 1 0 1 0 1 0 1 0 1 0 | 0 1 0 1 0 1 0 1 0 1 0 1 0 1 0 | 1 0 0 0 0 0 0 0 0 0 0 0 0 0 0 1 |

FIG.9B

WHEN INV="H"

| g0 | g2 | g1 | g3 | TM g0 |
|----|----|----|----|-------|
| 0 0 0 \| 0 0 0 0 1 1 1 1 \| 1 1 1 | 0 0 0 \| 1 1 1 1 0 0 0 0 \| 1 1 1 | 0 0 1 \| 0 0 1 1 0 0 1 1 \| 0 1 1 | 0 1 0 \| 0 1 0 1 0 1 0 1 \| 1 0 1 | 0 0 0 \| 1 \| 0 0 0 0 0 0 0 0 \| 1 \| 0 0 0 |

SEMICONDUCTOR MEMORY DEVICE CAPABLE OF OPERATING WITH POTENTIALS OF ADJACENT BIT LINES INVERTED DURING MULTI-BIT TEST

BACKGROUND OF THE INVENTION

1. Field of the Invention

The present invention relates to semiconductor memory devices. In particular, the present invention relates to a structure for implementing reduction in a test time of a semiconductor memory device and improvement of reliability of the test. More particularly, the present invention relates to a structure of a semiconductor memory device having a plurality of input/output pins enabling, by writing and reading data through a specific input/output pin, simultaneous input/output of data to the other input/output pins, in a test mode operation.

2. Description of the Background Art

With increase of a storage capacity of a semiconductor memory device and complication of its circuit structure, a chip having a latent defective factor which has been generated during its manufacturing process inevitably exists at a certain frequency immediately before shipment of the semiconductor memory device.

More specifically, there may be a latent defective factor of an MOS transistor which is a component of the semiconductor memory device, such as a defective gate insulating film, a defective interlayer insulating film between interconnections, a broken interconnection, a leakage current between interconnections, and a defect caused by a particle mixed during the manufacturing process. Shipment of such a semiconductor memory device having a latent defective factor as a product causes generation of a failure in a so-called "initial failure mode."

Therefore, screening is generally carried out by a so-called "burn-in" test in which a semiconductor memory device is operated under a high temperature and high pressure to reveal the initial defect and to eliminate the defective product before shipment. However, time required for the "burn-in" test becomes longer in proportion to a memory capacity even in a simple write/read cycle. Increase in the test time directly connects to increase in the chip cost.

In order to suppress increase in the test time, a structure is employed in which a plurality of semiconductor memory devices are arranged on a test board to test a number of semiconductor memory devices in parallel.

However, with a semiconductor memory device made far larger in capacity in recent years, the number of data input/output pins has increased. As a result, the number of semiconductor memory devices which can be tested simultaneously with one tester decreases. The test time is increased even if semiconductor memory devices are tested in parallel as described above, which in turn increases the test cost.

In order to prevent increase in the test cost, a multi-bit test is proposed. More specifically, by structuring a semiconductor memory device so as to carry out comparison and matching detection among a plurality of read data therein to output a signal indicating the result to a specific input/output terminal, the number of input/output terminals when seen from the side of the tester is apparently reduced in a test mode operation. By employing such a structure, it becomes possible to suppress decrease of the number of semiconductor memory devices which can be measured simultaneously by one tester.

FIG. 18 is a schematic block diagram showing a structure of a conventional semiconductor memory device capable of the above described multi-bit test operation.

In a reading operation in a normal operation mode, in response to external address signals A0 to Ai applied through an address signal input terminal 8, storage data of a specific memory cell selected from a memory cell array 15 is amplified by sense amplifiers 14 and 16 to be output to internal data buses by I/O circuits 14 and 16 as internal read data q0 to q3. Input/output buffer circuits 61 to 64 include switch circuits 91 to 94 switching a connection state with external input/output terminals 65 to 68 between the following two connection states. In response to a test mode specify signal TE generated by a control signal generating circuit 11, switch circuits 91 to 94 connect input/output buffer circuits 61 to 64 and input/output terminals 65 to 68 individually in the normal operation mode. More specifically, in FIG. 18, switch circuits 91 to 94 are connected in a state as indicated by the solid line.

Therefore, input/output buffer circuits 61 to 64 receive internal read data q0 to q3 read out from four memory cells, generate external read data DQ0 to DQ3, and output the data to data input/output terminals 65 to 68 individually.

In a writing operation in the normal operation mode, input/output buffer circuits 61 to 64 receive external write data DQ0 to DQ3 applied to external input/output terminals 65 to 68 to output the data individually to four memory cells selected by external address signals A0 to Ai through I/O circuits 14 and 16, oppositely in the above reading operation.

On the other hand, in response to a write enable signal EXT.W, an output enable signal EXT.OE, a row address strobe signal EXT.RAS, and a column address strobe signal EXT.CAS which are external control signals, and specific external address signals, for example, A0 and A1, of external address signals A0 to Ai, control signal generating circuit 11 detects that a test mode (for example, burn-in mode) was specified, and outputs an active test mode specify signal TE.

In response to test mode specify signal TE, switch circuits 90 to 94 connect input/output buffer circuits 61 to 64 together with a specific input/output terminal, for example, input/output terminal 65. More specifically, in FIG. 18, switch circuits 91 to 94 are connected in a state as indicated by the dotted line.

Therefore, in the writing operation in the test mode, write data applied to input/output terminal 65 is output in common to four memory cells selected by external address signals A0 to Ai through I/O circuits 14 and 16.

In the reading operation in the test mode, internal read signals q0 to q3 from four memory cells selected by external address signals A0 to Ai are applied to a logic synthesizing circuit 47. Logic synthesizing circuit 47 determines whether these signals match or mismatch. According to the determination result, logic synthesizing circuit 47 outputs a determination signal TMq0 to input/output terminal 65.

Therefore, in the test mode operation, data is input/output only through input/output terminal 65. More specifically, a semiconductor memory device in a x4 configuration can be tested as one in a x1 configuration in the normal operation. Therefore, even if the number of data input/output pins is increased in a semiconductor memory device, the number of semiconductor memory devices which can be simultaneously tested in parallel with one tester is not decreased.

The semiconductor memory device having the conventional data bit compression function is structured so that data from a specific input/output terminal is written in a plurality of memory cells in common. This structure rises the following problem.

FIG. 19 is a circuit diagram showing one example of a structure of a portion corresponding to memory cell array 15 and sense amplifier+I/O circuits 14 and 16 of a semiconductor memory device 201 capable of the multi-bit test operation.

Referring to FIG. 19, sense amplifiers 20, 22, and 24 are arranged opposite to sense amplifiers 21, 23, and 25 with bit line pairs therebetween. Respective bit lines are connected to the opposing sense amplifiers alternately. More specifically, a bit line ZBL10 of paired bit lines BL10 and ZBL10 connected to sense amplifier 21 is arranged between paired bit lines BL00 and ZBL00 connected to sense amplifier 20, for example.

Paired bit lines BL00 and ZBL00 are connected to internal data buses IO0 and ZIO0 through N channel MOS transistors 26a and 26b, respectively. Similarly, paired bit lines BL10 and ZBL10, BL20 and ZBL20, and BL30 and ZBL30 are connected to internal data buses IO1 and ZIO1, IO2 and ZIO2, and IO3 and ZIO3 through N channel MOS transistors 26c and 26d, 26e and 26f, and 26g and 26h, respectively.

The gate potentials of N channel MOS transistors 26a to 26h are controlled by the same column select signal CSL0.

Sense amplifier 20 is connected to bit line pair BL00, ZBL00, and according to power supply potential supplied from sense amplifier control lines S2N and S2B, amplifies the potential difference between the paired bit lines. Sense amplifiers 21, 22, and 23 connected to bit line pairs BL10, ZBL10, BL20, ZBL20, and BL30, ZBL30 similarly amplify the potential differences between the paired bit lines to which they are connected.

Internal data buses IO0 and ZIO0 are connected to input/output buffer circuit 61 to transmit internal read signal q0. Similarly, internal data buses IO1 and ZIO1, IO2 and ZIO2, and IO3 And ZIO3 are connected to input/output buffer circuits 62, 63, and 64, respectively, to transmit internal read signals q1, q2, and q3.

Memory cells 28a, 28b, 28c, and 28d are connected to crossing points between a word line WL0 and bit lines BL00, BL10, BL20, and BL30, respectively.

In the writing operation in the normal operation mode, external write data DQ0 to DQ3 applied from external terminals 65 to 68 are converted to complementary internal write signals corresponding thereto in input/output buffer circuits 61 to 64 to be transmitted to internal data buses IO0 and ZIO0 to IO3 and ZIO3. When word line WL0, for example, is selected in response to external address signals A0 to Ai, and internal data buses IO 0 and ZIO0 to IO3 and ZIO3 are connected to respective corresponding bit line pairs in response to column select signal CSL0, storage data corresponding to data applied to external input/output terminals 65 to 68 are to be individually written in memory cells 28a to 28d.

On the other hand, in the writing operation in a multi-bit test mode, a complementary signal according to data DQ0 applied to external input/output terminal 65, for example, is transmitted to all internal data buses IO0 and ZIO0 to IO3 and ZIO3 in common. If this write data is at a logical low or L level, for example, when data is written in memory cells 28a to 28d selected by word line WL0 and column select signal CSL0, bit lines BL00 to BL30 connected to these memory cells all attain the L level. On the other hand, bit lines ZBL00 to ZBL30 paired with these bit lines attain a logic high or H level.

In FIG. 19, a bit line potential arrangement is shown in the case where a signal at the L level is written in memory cells 28a to 28d, as described above. Since the bit line pairs are arranged alternately, the adjacent bit lines, for example, BL00 and BL10 are both at the L level, and bit lines ZBL00 and ZBL10 are both at the H level.

When data is written in a multi-bit test operation as described above in a burn-in test mode, the following problem occurs. More specifically, in the burn-in test, it is necessary to reveal a latent leakage current between bit lines or the like, for example. However, if data is written in bit line pairs arranged as described above in the multi-bit test operation, the adjacent bit lines have the same potential, causing no voltage stress applied between these bit lines. Therefore, a latent defect between these adjacent bit lines cannot be detected in the burn-in test, decreasing the reliability of the burn-in test conducted before shipment.

SUMMARY OF THE INVENTION

One object of the present invention is to provide a semiconductor memory device capable of applying voltage stress between arbitrary adjacent bit lines during a multi-bit test operation in a burn-in test mode or the like.

Another object of the present invention is to provide a semiconductor memory device capable of preventing increase of malfunction and current consumption caused by a signal from an input/output terminal not used in a multi-bit test operation.

In brief, according to one aspect of the present invention, a semiconductor memory device includes a plurality of word lines, a plurality of bit line pairs, a plurality of memory cells, a memory cell selecting circuit, and a plurality of input buffer circuits. The plurality of bit line pairs cross the plurality of word lines, and are divided into first and second groups. The plurality of memory cells are, connected to the word lines and the bit line pairs, arranged in rows and columns. In response to an external address signal, the memory cell selecting circuit reads/writes storage data with respect to a corresponding memory cell. The plurality of input buffer circuits receive a plurality of input data in parallel from outside to output the data to the memory cell selecting circuit. The input buffer circuits are divided into first and second groups corresponding to the first and second groups of the bit line pairs. Each of the input buffer circuits belonging to the first and second groups includes a first switch circuit responsive to an externally applied operation mode specify signal for switching between a first state in which each input buffer circuit receives input data corresponding thereto and a second state in which each input buffer circuit receives input data corresponding to a predetermined input buffer circuit among the input buffer circuits in common. Each of the input buffer circuits belonging to the first group further includes a first inverting circuit for inverting the input data in response to an externally applied inversion designate signal when the input buffer circuit is in the second state.

According to another aspect of the present invention, a semiconductor memory device includes a plurality of word lines, a plurality of bit line pairs, a plurality of memory cells, a memory cell selecting circuit, and a plurality of input buffer circuits. The plurality of bit line pairs cross the plurality of word lines, and are divided into first and second groups. The plurality of memory cells are, connected to the word lines and the bit line pairs, arranged in rows and columns. In response to an external address signal, the memory cell selecting circuit reads/writes storage data with respect to a corresponding memory cell. The plurality of input buffer circuits are divided into a plurality of groups, and receive a plurality of input data from outside in parallel to output the data to the memory cell selecting circuit. The input buffer circuits of each group are divided into first and second subgroups corresponding to the first and second groups of the bit line pairs. Each of the input buffer circuits belonging to the first and second subgroups includes a first switch circuit responsive to an externally applied operation mode specify signal for switching between a first state in which each input buffer circuit receives input second responding thereto and a second state in which each input buffer circuit receives input data corresponding to a predetermined input buffer circuit in each group of the input buffer circuits in common. Each of the input buffer circuits belonging to the first subgroup further includes a first inverting circuit for inverting the input data in response to an externally applied inversion designate signal when the input buffer circuit is in the second state.

According to still another aspect of the present invention, a semiconductor memory device includes a plurality of word lines, a plurality of bit line pairs, a plurality of memory cells, a memory cell selecting circuit, and a plurality of input buffer circuits. The plurality of bit line pairs cross the plurality of word lines, and are divided into first and second groups. The plurality of memory cells are, connected to the word lines and the bit line pairs, arranged in rows and columns. The memory cell selecting circuit reads/writes storage data with respect to a corresponding memory cell in response to an external address signal. The plurality of input buffer circuits receive a plurality of input data from outside in parallel to output the data to the memory cell selecting circuit. The input buffer circuits are divided into first and second groups corresponding to the first and second groups of the bit line pairs. Each of the input buffer circuits belonging to the first and second groups includes a first switch circuit responsive to an externally applied operation mode specify signal for switching between a first state in which each input buffer circuit receives input data corresponding thereto and a second state in which each input buffer circuit receives input data corresponding to a predetermined input buffer circuit among the input buffer circuits in common. Each of the input buffer circuits belonging to the first group further includes a first input control circuit responsive to a first external control signal for controlling output of the input data to the memory cell selecting circuit. Each of the input buffer circuits belonging to the second group includes a second input control circuit responsive to a second external control signal for controlling output of the input data to the memory cell selecting circuit.

According to a further aspect of the present invention, a semiconductor memory device includes a plurality of word lines, a plurality of bit line pairs, a plurality of memory cells, a memory cell selecting circuit, and a plurality of input buffer circuits. The plurality of bit line pairs cross the plurality of word lines, and are divided into first and second groups. The plurality of memory cells are, connected to the word lines and the bit line pairs, arranged in rows and columns. The memory cell selecting circuit reads/writes storage data with respect to a corresponding memory cell in response to an external address signal. The plurality of input buffer circuits are divided into a plurality of groups, and receive a plurality of input data from outside in parallel to output the data to the memory cell selecting circuit. The input buffer circuits of each group are divided into first and second subgroups corresponding to the first and second groups of the bit line pairs. Each of the input buffer circuits belonging to the first and second subgroups includes a first switch circuit responsive to an externally applied operation mode specify signal for switching between a first state in which each input buffer circuit receives input data corresponding thereto and a second state in which each input buffer circuit receives input data corresponding to a predetermined input buffer circuit in each group of the input buffer circuits in common. Each of the input buffer circuits belonging to the first subgroup includes a first input control circuit responsive to a first external control signal for controlling output of the input data to the memory cell selecting circuit. Each of the input buffer circuits belonging to the second subgroup includes a second input control circuit responsive to a second external control signal for controlling output of the input data to the memory cell selecting circuit.

According to the present invention, a voltage stress can be applied between all adjacent bit lines by bringing the inversion designate signal to an active or non-active state, whereby a latent defect between the bit lines can be revealed in the burn-in test. This is the main advantage of the present invention.

More specifically, the structure of the present invention enables reduction of a test time required for the burn-in test or the like and improvement of the reliability of the test result.

According to the present invention, when reading and writing operations are carried out using the data bit compression function in the test mode, the test in the operation state can be carried out by writing and reading data only from a specific external input/output terminal. Therefore, in addition to improvement of the reliability of the burn-in test, the number of semiconductor memory devices which can be tested simultaneously in parallel can be increased, whereby the test time can be shortened. This is another advantage of the present invention.

According to the present invention, in the test mode, even when an external input/output terminal not used for data writing is in an electrically floating state at an intermediate potential, for example, this potential is not transmitted to internal circuitry. Therefore, there is no through current flowing in a CMOS circuit configuring the input buffer circuit, preventing an erroneous operation. This is still another advantage of the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 5A and 5B are timing charts showing operation of the input buffer circuit in a test mode according to the first embodiment of the present invention, wherein FIG. 5A shows operation when an inversion designated signal is non-active, and FIG. 5B shows operation when the inversion designate signal is active.

FIGS. 9A and 9B are diagrams describing operation of the logic synthesizing circuit, wherein FIG. 9A shows operation when the inversion designate signal is non-active, and FIG. 9B shows operation when the inversion signal is active.

DESCRIPTION OF THE PREFERRED EMBODIMENTS

[First Embodiment]

Figure 1:
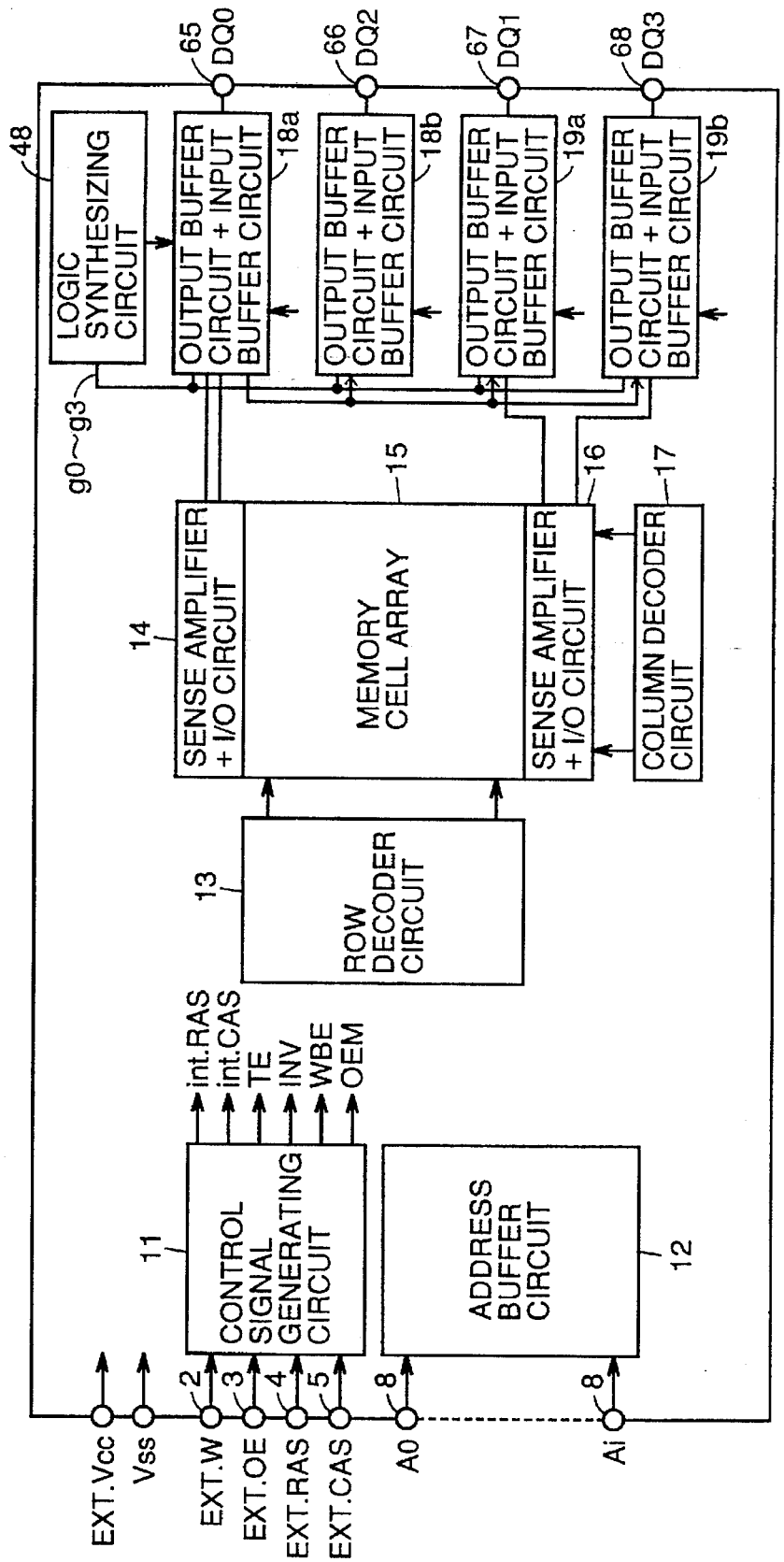
FIG. 1 is a schematic block diagram showing a structure of a semiconductor memory device according to a first embodiment of the present invention.

Referring to FIG. 1, a semiconductor memory device 101 includes control signal generating circuit 11 receiving external control signals EXT.W, EXT.OE, EXT.RAS, and EXT.CAS supplied through external control signal input terminals 2 to 5 to generate internal control signals, memory cell array 15 including memory cells arranged in rows and columns, address buffer circuit 12 receiving external address signals A0 to Ai supplied through address signal input terminal 8 to generate an internal row address signal and an internal column address signal under the control of control signal generating circuit 11, and row decoder circuit 13 activated under the control of control signal generating circuit 11 to decode the internal row address signal supplied from address buffer circuit 12 to select a row (word line) of memory cell array 15.

Signal EXT.W applied to an external control signal input terminal 2 is a write enable signal specifying data writing. Signal EXT.OE applied to an external control signal input terminal 3 is an output enable signal specifying data output. Signal EXT.RAS applied to an external control signal input terminal 4 is a row address strobe signal starting internal operation of the semiconductor memory device and determining an active period of the internal operation. When signal EXT.RAS is in an active state, a circuit such as row decoder circuit 13 associated with selection of a row in memory cell array 15 is brought to the active state. Signal EXT.CAS applied to an external control signal input terminal 5 is a column address strobe signal, which brings a circuit selecting a column in memory cell array 15 to the active state.

Control signal generating circuit 11 outputs an internal row strobe signal int.RAS, an internal column strobe signal int.CAS, an internal write enable signal WBE, and an internal output enable signal OEM in response to external row strobe signal EXT.RAS, external column strobe signal EXT.CAS, external write enable signal EXT.W, and external output enable signal EXT.OE, respectively.

Semiconductor memory device 101 further includes column decoder circuit 17 activated under the control of control signal generating circuit 11 for decoding the internal column address signal from address buffer circuit 12 to generate a column select signal selecting a column in memory cell array 15, a sense amplifier for sensing and amplifying data of memory cells connected to a selected row in memory cell array 15, an I/O circuit responsive to the column select signal from column decoder circuit 17 for connecting the selected column in memory cell array 15 to an internal data bus, and input/output buffer circuits 18a, 18b, 19a, and 19b for generating external read data DQ0 to DQ3 from internal read data q0 to q3 read out to the internal data bus at the time of data reading to output the data to data input/output terminals 65 to 68 under the control of control signal generating circuit 11. In FIG. 1, one sense amplifier and one I/O circuit are shown in one block 14 (16). In the reading operation, input/output buffer circuits 18a, 18b, 19a, and 19b are brought to the active state according to activation (change to the H level) of internal output enable signal OEM generated in control signal generating circuit 11 in response to external output enable signal EXT.OE. In the writing operation, input/output buffer circuits 18a, 18b, 19a, and 19b are brought to the active state according to activation of internal write enable signal WBE generated in control signal generating circuit 11 in response to external write enable signal EXT.W.

Control signal generating circuit 11 further receives external control signals EXT.W, EXT.OE, EXT.RAS, EXT.CAS, and specific external address signals, for example, A0 and A1 of external address signals A0 to Ai to detect that the test mode (for example, burn-in test) was specified, and to bring a test mode detect signal TE to the active state (H level state).

Figure 2:
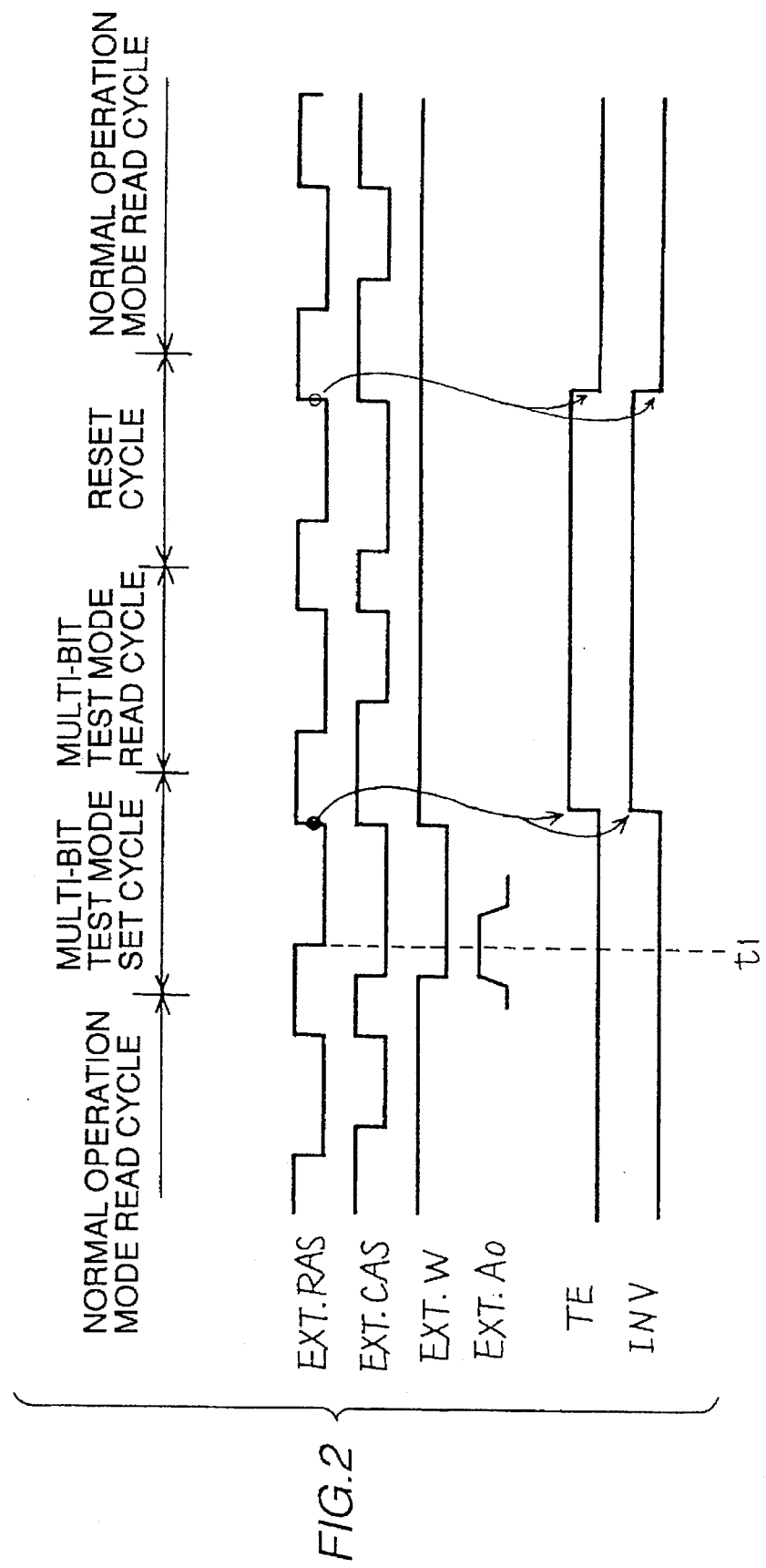
FIG. 2 is a timing chart showing operation of the semiconductor memory device according to the first embodiment of the present invention.

FIG. 2 is a timing chart describing operation of setting or resetting the test mode in response to the external control signal. In the following, description will be given of the "burn-in" test. However, a special test mode specified in response to the external control signal may be the other operation modes.

Referring to FIG. 2, the burn-in test operation mode includes three cycles: a set cycle for setting the burn-in test; a burn-in test mode in which the burn-in test is actually conducted; and a reset cycle for resetting the burn-in test.

In the set cycle, signals EXT.CAS and EXT.W are both brought to the L level in the active state before falling of external control signal EXT.RAS, and signal A0, for example, of the external address signals is set at a voltage level sufficiently higher than a high level (VIH) during the normal operation. More specifically, the burn-in test mode is set by a so-called "WCBR+super $V_{cc}$" condition being satisfied.

According to transition of signal EXT.RAS to a non-active state (H level state) after setting of the burn-in test mode, control signal generating circuit 11 brings both test mode specify signal TE and an inversion designate signal INV to the active state (H level state). Operation of input/output buffer circuits 18a, 18b, 19a, and 19b is hereinafter switched to the test mode operation in response to test mode specify signal TE and inversion designate signal INV, as will be described layer.

Read and write cycles in the burn-in test mode are carried out in this state to detect defective operation.

At the end of the burn-in test mode, the burn-in test mode is reset by a so-called "CBR" condition being satisfied in which signal EXT.W is brought to the H level and signal EXT.CAS is brought to the L level in the active state before falling of external control signal EXT.RAS. According to transition of signal. EXT.RAS to the non-active state (H level state) after sensing this condition being satisfied, control signal generating circuit 11 brings test mode specify signal TE and inversion designate signal INV to the non-active state (L level state).

In the above description, both test mode specify signal TE and inversion designate signal INV are brought to the active state during the burn-in test mode. However, inversion designate signal INV may be brought to the active or non-active state according to the level of another external address signal A1 in the burn-in mode set cycle, for example.

Figure 3:
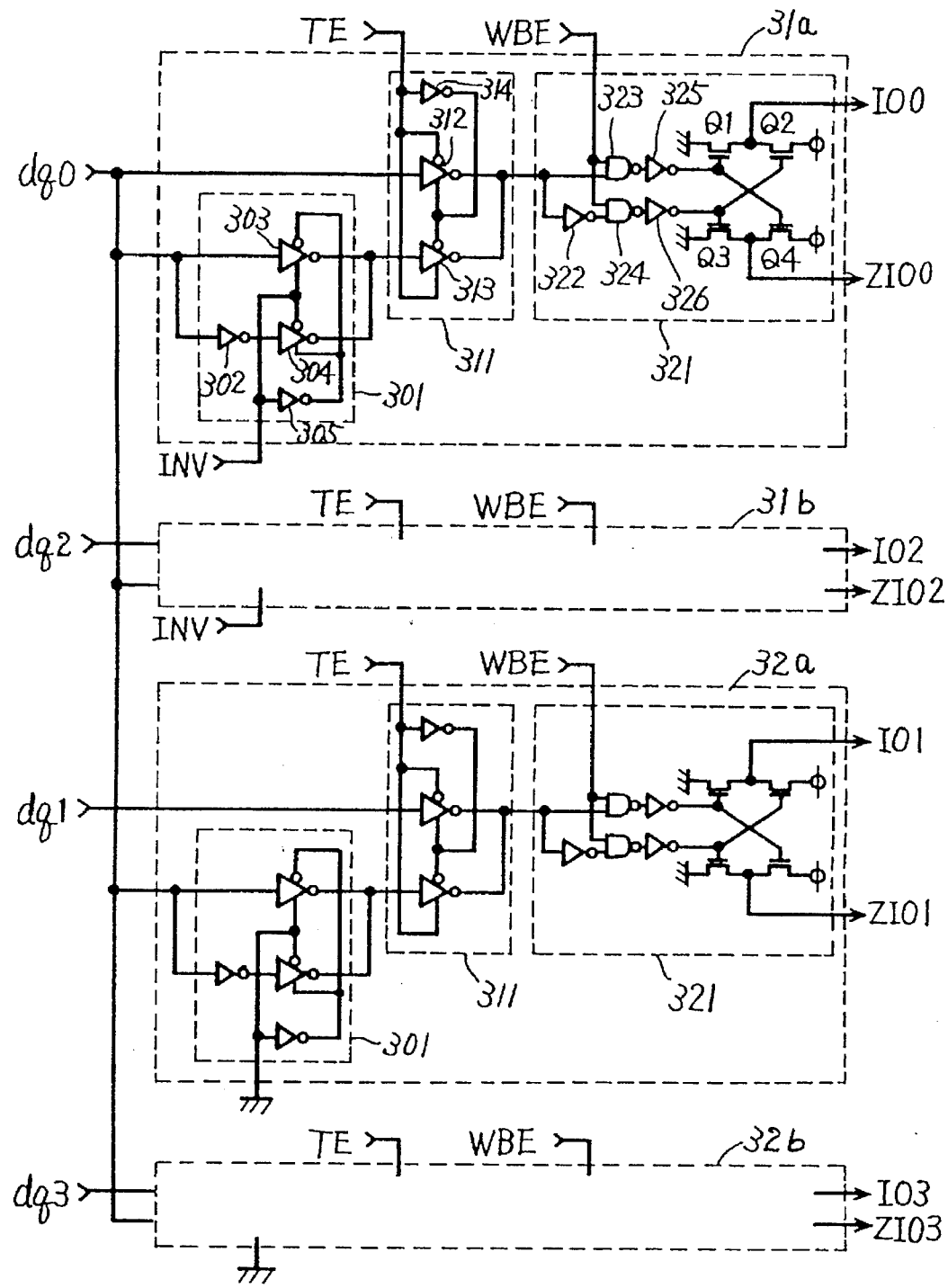
FIG. 3 is a circuit diagram showing a structure of an input buffer circuit in the semiconductor memory device according to the first embodiment of the present invention.

Referring to FIG. 3, input buffer circuits 31a, 31b, 32a, and 32b are included in input/output buffer circuits 18a, 18b, 19a, and 19b in FIG. 1, respectively. Input buffer circuits 31a and 32a are the same as input buffer circuits 31b and 32b in structure, respectively. Therefore, in the following, description will be given of structure and operation of input buffer circuits 31a and 32a.

Input buffer circuit 31a includes an inverting circuit 301 inverting an input signal in response to inversion designate signal INV, a switch circuit 311 switching a path of input data in response to test mode specify signal TE, and an input control circuit 321 controlled by internal write enable signal WBE for receiving the output of switch circuit 311 to output complementary internal write data to internal data buses IO0 and ZIO0. Inverting circuit 301 includes a clocked inverter circuit 303 receiving a signal dq0 according to write data applied to external input/output terminal 65 as input and controlled by inversion designate signal INV to be brought to the active state when signal INV is at the H level, an inverter circuit 302 receiving signal dq0, a clocked inverter circuit 304 receiving the output of inverter circuit 302 and controlled by inversion designate signal INV to be brought to the active state when signal INV is at the L level, and an inverter circuit 305 receiving inversion designate signal INV to output a control signal to clocked inverter circuits 303 and 304.

Switch circuit 311 includes a clocked inverter circuit 312 receiving signal dq0 and controlled by test mode specify signal TE to be brought to the active state when signal TE is at the L level, a clocked inverter circuit 313 receiving the output of inverting circuit 301 and controlled by test mode specify signal TE to be brought to the active state when signal TE is at the H level, and an inverter circuit 314 receiving test mode specify signal TE to output a control signal to clocked inverter circuits 312 and 313.

Input control circuit 321 includes an inverter circuit 322, NAND circuits 323 and 324, inverter circuits 325 and 326, and N channel MOS transistors Q1, Q2, Q3, and Q4.

NAND circuit 323 receives internal write enable signal WBE and the output of switch circuit 311. Inverter circuit 325 receives the output of NAND circuit 323. Inverter circuit 322 receives the output of switch circuit 311, and NAND circuit 324 receives internal write enable signal WBE and the output of inverter circuit 322. Inverter circuit 326 receives the output of NAND circuit 324. N channel MOS transistors Q1 and Q2 are connected in series between power supply potential corresponding to the H level and ground potential corresponding to the L level, and N channel MOS transistors Q3 and Q4 are also connected in series between the power supply potential and the ground potential. The gates of N channel MOS transistors Q1 and Q4 are connected to an output node of inverter circuit 325. The gates of N channel MOS transistors Q2 and Q3 are connected to an output node of inverter circuit 326. A connection point between N channel MOS transistors Q1 and Q2 and internal data bus IO0 are connected, and a connection point between N channel MOS transistors Q3 and Q4 and internal data bus ZIO0 are connected.

Operation of input buffer circuit 31a will now be described. Description will first be given of the normal operation mode, that is, the case where test mode specify signal TE is at the L level.

In this case, in switch circuit 311, cloaked inverter circuit 312 is in the active state and inverts an input signal for output, and clocked inverter circuit 313 is in the non-active state. Therefore, an output node of inverting circuit 301 and input control circuit 321 are disconnected.

When signal DQ0 is at the H level, for example, the output of clocked inverter circuit 312 attains the L level.

While internal write enable signal WBE is in the non-active state (L level state), the outputs of NAND circuits 323 and 324 are both at the H level, and the outputs of inverter circuits 325 and 326 are both at the L level, irrespective of the level of the output signal of switch circuit 311. Therefore, N channel MOS transistors Q1 to Q4 are all in a non-conductive state, and internal data buses IO0 and ZIO0 are both in a high impedance state.

On the other hand, when internal write enable signal WE attains the active state (H level state), the output of NAND circuit 323 attains the H level, and the output of NAND circuit 324 attains the L level, because of the L level of the output signal of clocked inverter circuit 312 which is the output of switch circuit 311, as described above. Therefore, the output of inverter circuit 325 attains the L level, rendering N channel MOS transistors Q1 and Q4 non-conductive. On the other hand, the output of inverter circuit 326 is at the H level, rendering N channel MOS transistors Q2 and Q3 conductive. Therefore, internal data bus IO0 attains the H level, and internal data bus ZIO0 attains the L level. More specifically, the potentials of internal data buses IO0 and ZIO0 change corresponding to signal dq0 being at the H level.

The operation of input buffer circuit 31a in the test mode, that is, in the case where test mode specify signal TE is in the active state (H level state) will now be described.

In this case, in switch circuit 311, clocked inverter circuit 312 is in the non-active state, and clocked inverter circuit 313 is in the active state. Therefore, the output node of inverting circuit 301 is connected to input control circuit 321.

In inverting circuit 301, when inversion designate signal INV is in the non-active state (L level state), clocked inverter circuit 304 is in the active state, and clocked inverter circuit 303 is in the non-active state. Therefore, when signal dq0 is at the H level, for example, a signal passing through inverter circuit 302 and clocked inverter circuit 304 is provided as the output of inverting circuit 301. More specifically, the output of inverting circuit 301 is at the H level, which is the same level as that of signal dq0. On the other hand, when inversion designate signal INV is in the active state (H level state), clocked inverter circuit 303 is in the active state, and clocked inverter circuit 304 is in the non-active state in inverting circuit 301. Therefore, the output signal of inverting circuit 301 attains the L level, which is obtained by inversion of signal dq0 by clocked inverter circuit 303.

When internal write enable signal WBE is in the non-active state, input control circuit 321 brings internal data buses IO0 and ZIO0 to the high impedance state. When signal WBE is brought to the active state, input. control circuit 321 brings, according to the level of an input signal, internal data bus IO0 to the same level as that of the input signal and internal data bus ZIO0 to a level complementary to that of the input signal. Therefore, in the test mode, in response to internal write enable signal WBE attaining the active state when signal dq0 is at the H level as described above, for example, internal data buses IO0 and ZIO0 attain the H level and the L level, respectively, when inversion designate signal INV is in the non-active state, and internal data buses IO0 and ZIO0 attain the L level and the H level, respectively, when inversion designate signal INV is in the active state.

Input buffer circuit 31b is similar to input buffer circuit 31a in structure. Input buffer circuit 31b is different from input buffer circuit 31a in operation in that in input buffer circuit 31b, the levels of internal data buses IO2 and ZIO2 are changed according to the level of a write signal dq2 corresponding to a signal input to external input/output terminal 66 in the normal operation mode. On the other hand, in the test mode, since switch circuit 311 connects the output node of inverting circuit 301 receiving signal dq0 with input control circuit 321, input buffer circuit 31b changes the potential levels of internal data buses IO2 and ZIO2 according to the level of signal dq0 and inversion designate signal INV, similarly to input buffer circuit 31a.

Input buffer circuit 32a is also the same as input buffer circuit 31a in structure. These input buffer circuits are different in that in input buffer circuit 32a, the potential level of a node to which the inversion designate signal is applied is fixed at the L level.

Therefore, input buffer circuit 32a changes the potential levels of internal data buses IO1 and ZIO1 according to the level of write data dq1 corresponding to data applied to external input/output terminal 67 in the normal operation mode. On the other hand, input buffer circuit 32a changes the potential levels of internal data buses IO1 and ZIO1 according to the level of signal dq0 when internal write enable signal WBE is brought to the active state in the test mode, since inverting circuit 301 is fixed to a state of outputting a signal at the same level as that of the applied signal, and switch circuit 311 connects the output node of inverting circuit 301 with input control circuit 321.

Input buffer circuit 32b is also similar to input buffer circuit 32a in operation except that in input buffer circuit 32b, the potential levels of internal data buses IO3 and ZIO3 are changed according to a signal dq3 corresponding to data applied to external input/output terminal 68 in the normal operation mode.

Based on the above described operation of input buffer circuits 31a, 31b, 32a, and 32b, operation of semiconductor memory device 101 according to the first embodiment of the present invention will be described.

Figure 4:
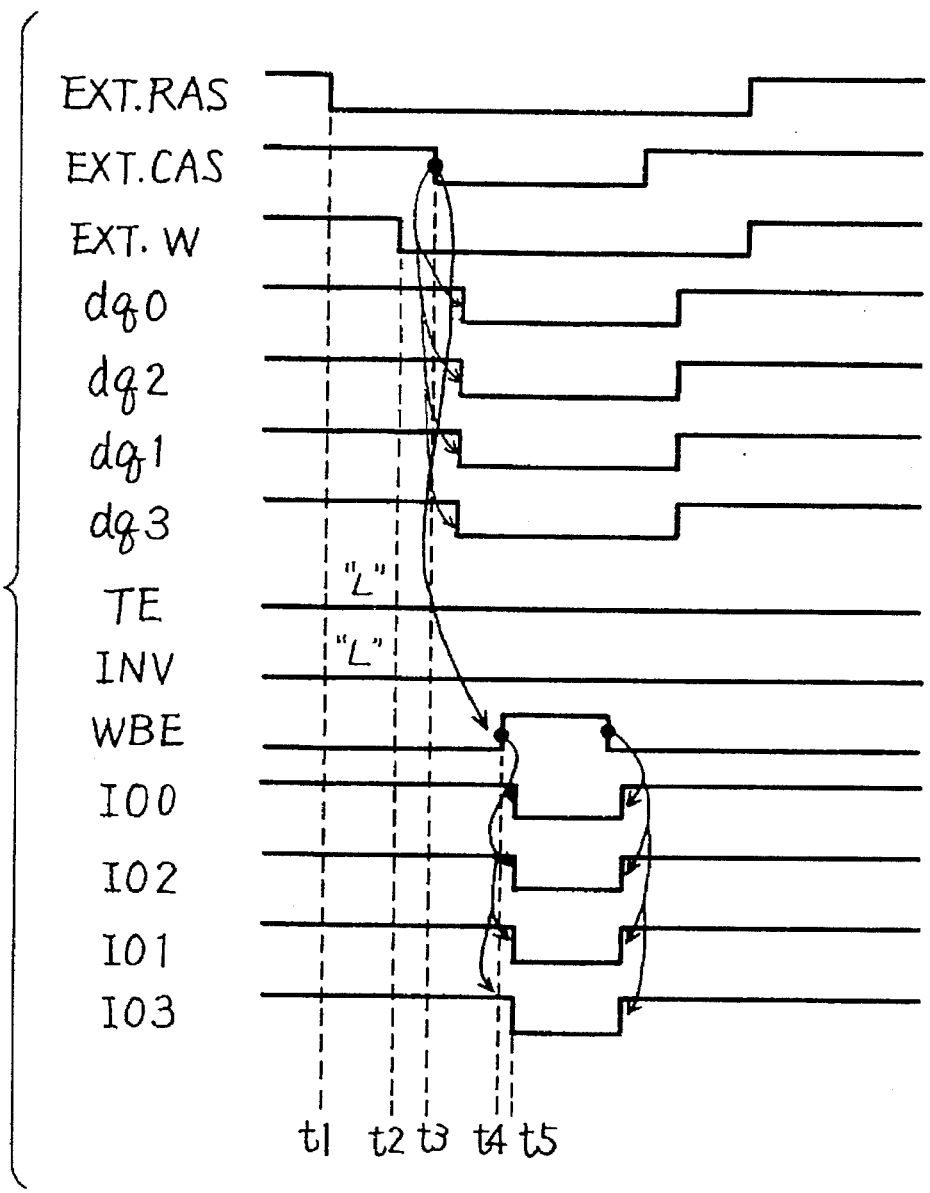
FIG. 4 is a timing chart showing operation of the input buffer circuit in a normal operation mode according to the first embodiment of the present invention.

FIG. 4 is a timing chart showing writing operation to semiconductor memory device 101 in the normal operation mode.

In the following description, it is assumed that write data applied to external input/output terminals 65 to 68 are all at the L level.

At time t1, external row strobe signal EXT.RAS falls to the L level. After that, at time t3, external column strobe signal EXT.CAS falls to the L level. Accordingly, internal write enable signal WBE changes to the H level at time t4.

At this time, test mode specify signal TE and inversion designate signal INV are both at the L level, and signals dq0 to dq3 corresponding to write signals are all at the L level. Therefore, in response to rising of internal write enable signal WBE, internal data buses IO0 to IO3 all change to the L level at time t5, whereby data is written in corresponding memory cells.

Figure 5B:
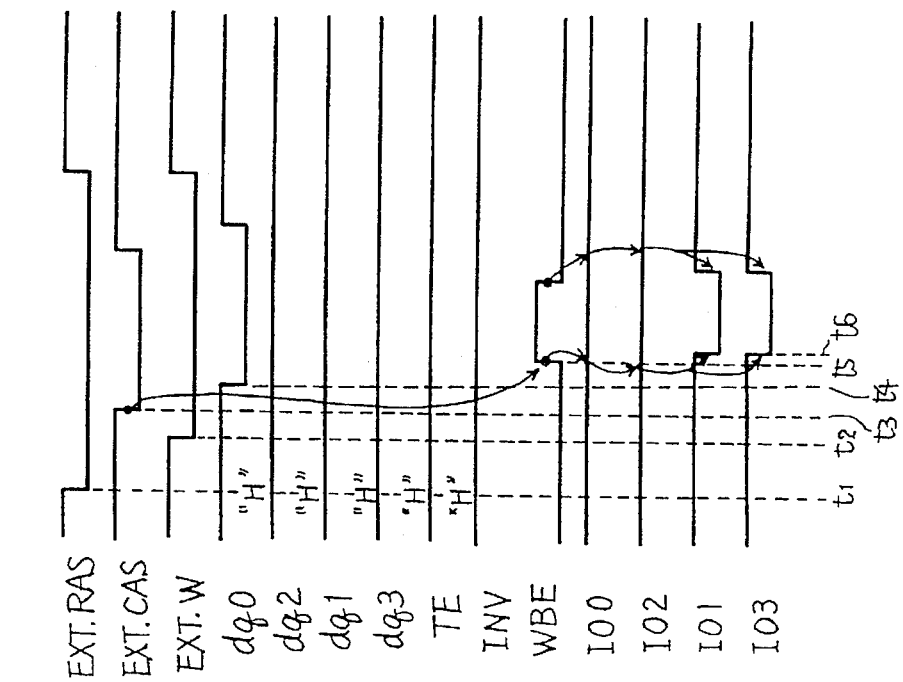
Figure 5A:
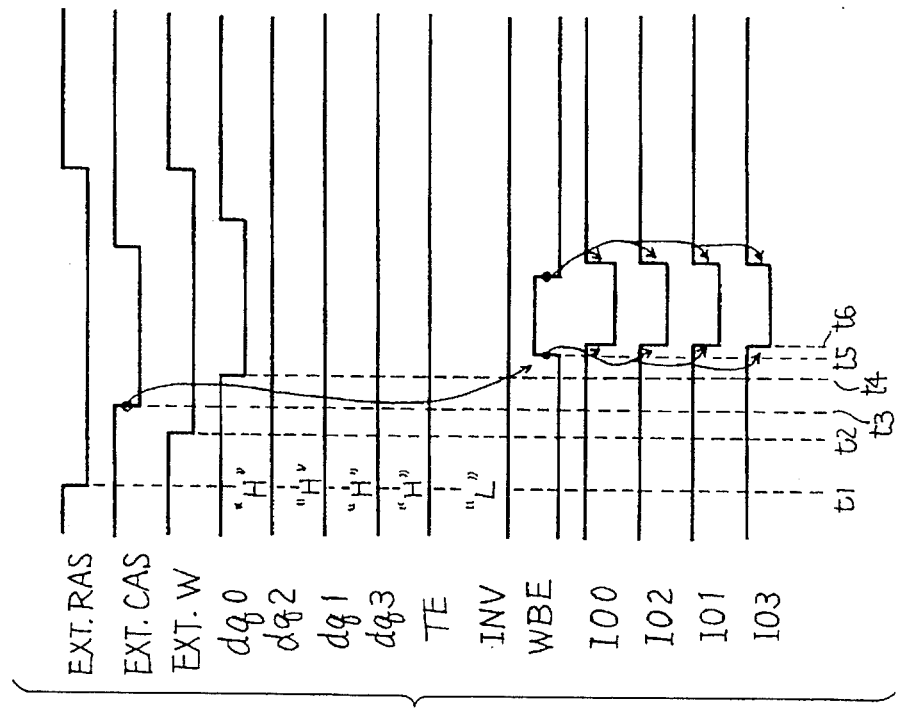

FIGS. 5A and 5B are timing charts showing operation when writing of data to semiconductor memory device 101 is conducted in the test mode using a data bit compression function.

Referring to FIG. 5A, description will first be given of operation in the case where inversion designate signal INV is in the non-active state (L level state).

In the test mode, test mode specify signal TE is in the active state (H level state), and input data to external input/output terminal 65 is applied to all input buffer circuits 31a, 31b, 32a, and 32b. Therefore, after external row strobe signal EXT.RAS falls to the L level at time t1, external cas strobe signal EXT.CAS falls to the L level at t3 and then only signal dq0 is pulled down to the L level at time t4.

In response to falling of external column strobe signal EXT.CAS to the L level at time t3, internal write enable signal WBE changes to the active state (H level state) at time t5. In FIG. 5A, at time t5, only signal dq0 is at the L level, and signals dq1 to dq3 remain at the H level. However, since only signal dq0 is transmitted to input buffer circuits 31a, 31b, 32a, and 32b in the test mode, as described above, the potential levels of all internal data buses IO0 to IO3 fall to the L level in response to signal dq0 at time t6, and these data are written in corresponding memory cells.

On the other hand, operation in the case where inversion designate signal INV is in the active state (H level state) in the test mode is as follows.

Referring to FIG. 5B, test mode specify signal TE is at the H level, and only signal dq0 corresponding to input data from external input/output terminal 65 is applied to input buffer circuits 31a, 31b, 32a, and 32b also in this case. However, since inversion designate signal INV is at the H level, the potential levels of internal data buses IO1 and IO3 both attain the L level according to the level of signal dq0 at time t6, while the potential levels of internal data buses IO0 and IO2 attain the H level, which is opposite to that of signal dq0.

Figure 6:
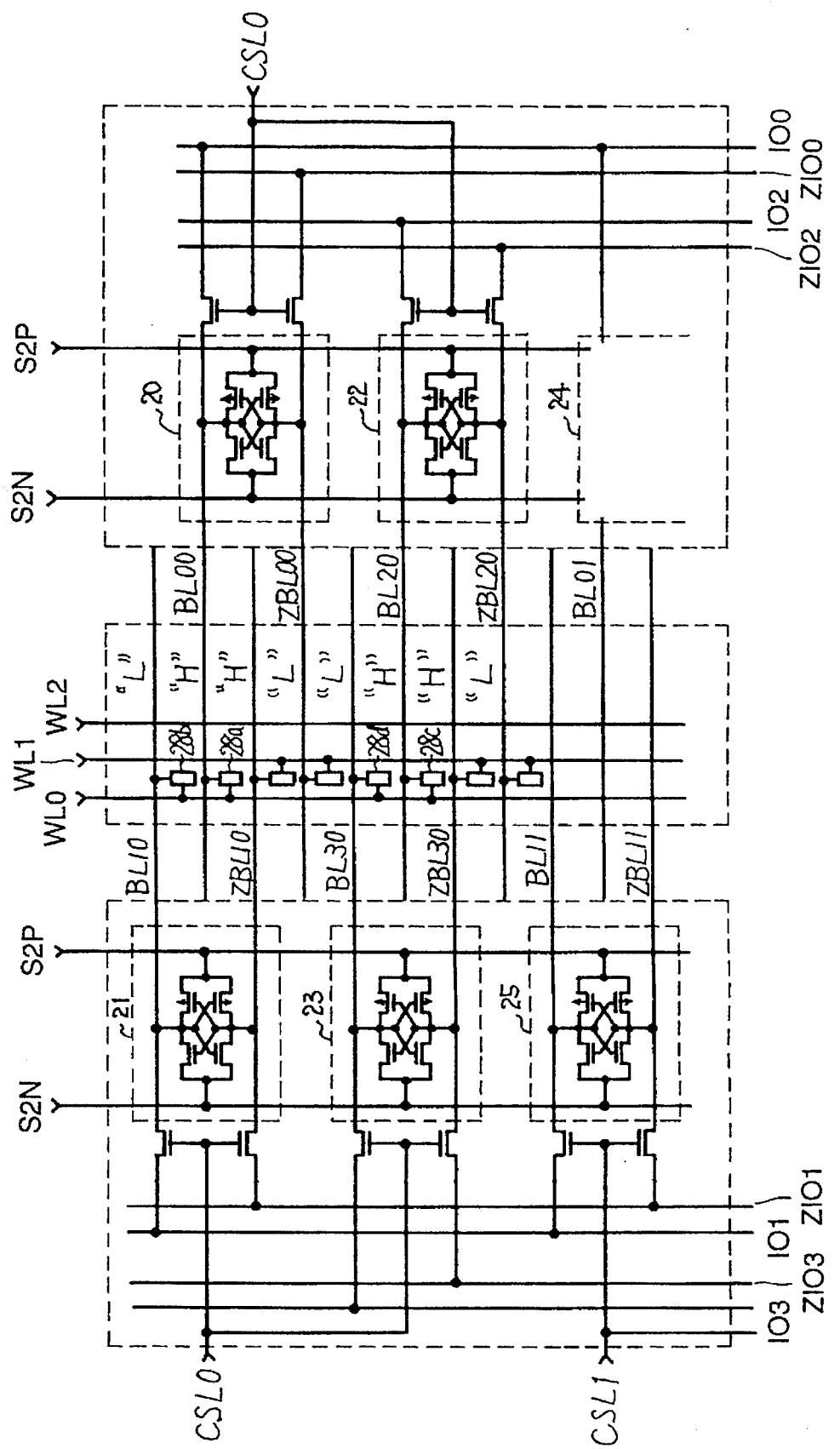
FIG. 6 is a circuit diagram showing a structure of a memory cell array and a sense amplifier portion of the semiconductor memory device according to the first embodiment of the present invention.

FIG. 6 is a circuit diagram showing a main portion corresponding to memory cell array 15 and sense amplifier +IO circuits 14 and 16 in semiconductor memory device 101 according to the first embodiment of the present invention.

Figure 19:
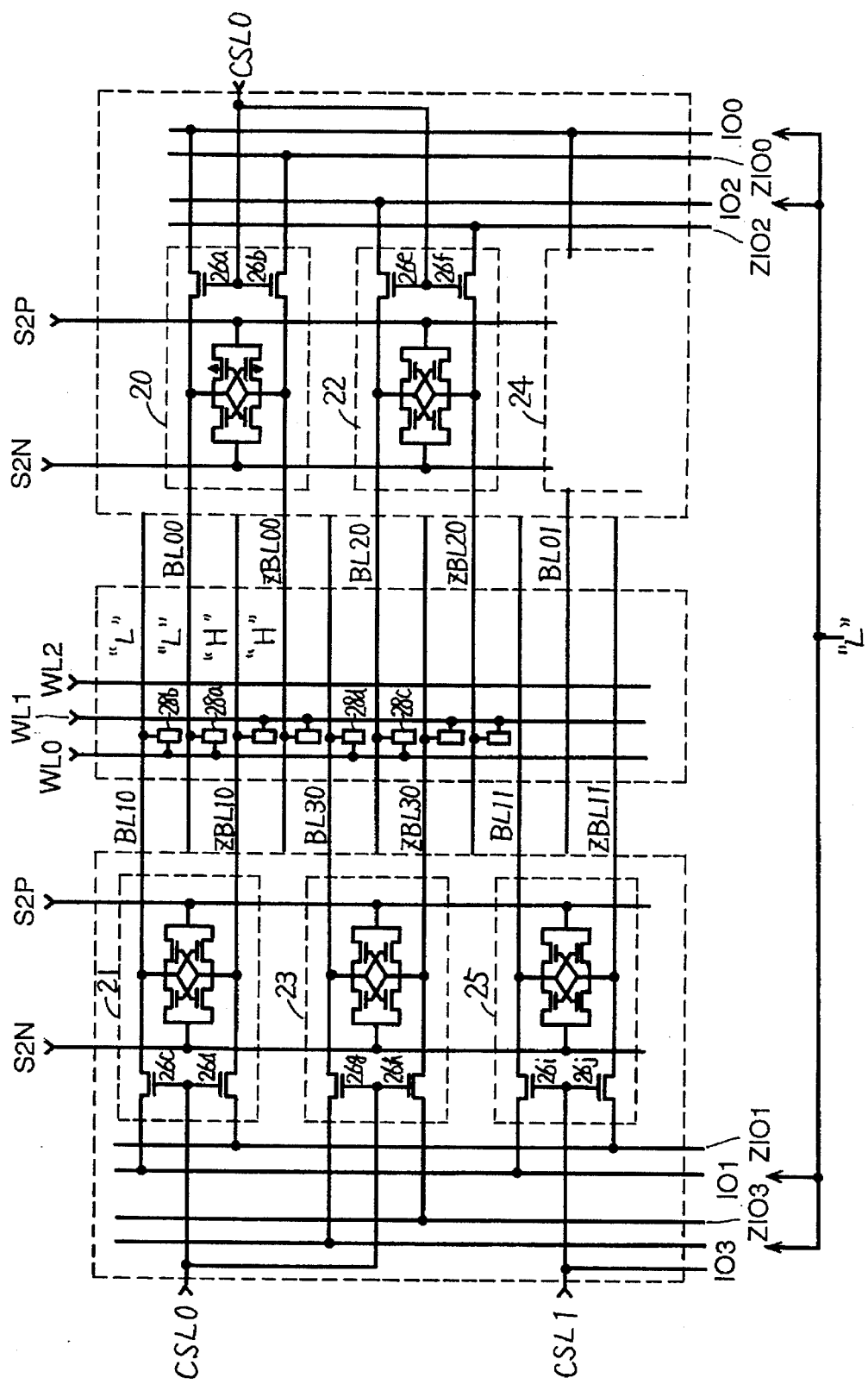
FIG. 19 is a circuit,diagram showing a memory cell array and a sense amplifier portion of the semiconductor memory device capable of a multi-bit test operation.

Similar to the conventional example shown in FIG. 19, sense amplifiers 20 to 25 are arranged on both sides with bit line pairs therebetween, and bit lines connected to sense amplifiers on one side and bit lines connected to sense amplifiers on the other side are alternately arranged, also in the present embodiment.

More specifically, bit line ZBL10 of paired bit lines BL10 and ZBL10 connected to sense amplifier 21 is arranged between paired bit lines BL0 and ZBL0 connected to sense amplifier 20.

Paired bit lines BL20 and ZBL20 connected to sense amplifier 22 and paired bit lines BL30 and ZBL30 connected to sense amplifier 23 are similarly arranged.

Paired bit lines BL00 and ZBL00, paired bit lines BL10 and ZBL10, paired bit lines BL20 and ZBL20, and paired bit lines BL30 and ZBL30 are connected to internal data buses IO0 and ZIO0, IO1 and ZIO1, IO2 and ZIO2, and IO3 and ZIO3 through N channel MOS transistors 26a and 26b, 26c and 26d, 26e and 26f, and 26g and 26h, respectively. The gate potentials of N channel MOS transistors 26a to 26h are all controlled by column select signal CSL0 in common.

In the following description, the case is to be considered where inversion designate signal INV is brought to the active state in the multi-bit test mode, and where data is written in memory cells 28a to 28d selected by word line WL0 and column select signal CSL0, as described with reference to FIG. 5B.

In this case, an input signal applied to external input/output terminal 65 is at the L level, and this signal at the L level is applied to all input buffer circuits 31a, 31b, 32a, and 32b. However, since inversion designate signal INV is in the active state, the levels of internal data buses IO0 and IO2 are brought to the H level, and the levels of internal data buses IO1 and IO3 are brought to the L level. Therefore, when column select signal CSL0 is brought to the active state to connect internal data buses IO0 and ZIO0 to IO3 and ZIO3 with paired bit lines BL00 and ZBL00 to BL30 and ZBL30, the potentials of paired bit lines BL00 and ZBL00 attain the H level and the L level, respectively, and the potentials of paired bit lines BL10 and ZBL10 attain the L level and the H level, respectively. When this state is compared to the case shown in FIG. 19, it is found that the potential levels of bit lines BL00 and BL10, which are the same in FIG. 19, become opposite to each other, and that the potential levels of bit lines ZBL00 and ZBL10 also become opposite to each other.

More specifically, by configuring input buffer circuits 31a, 31b, 32a, and 32b as in the first embodiment of the present invention, it becomes possible to apply opposite potentials to bit lines which could not have different potential levels from each other in the data bit compression mode in conventional semiconductor memory device 201. As a result, a voltage stress can be applied between these bit lines in the burn-in test mode.

Figure 7:
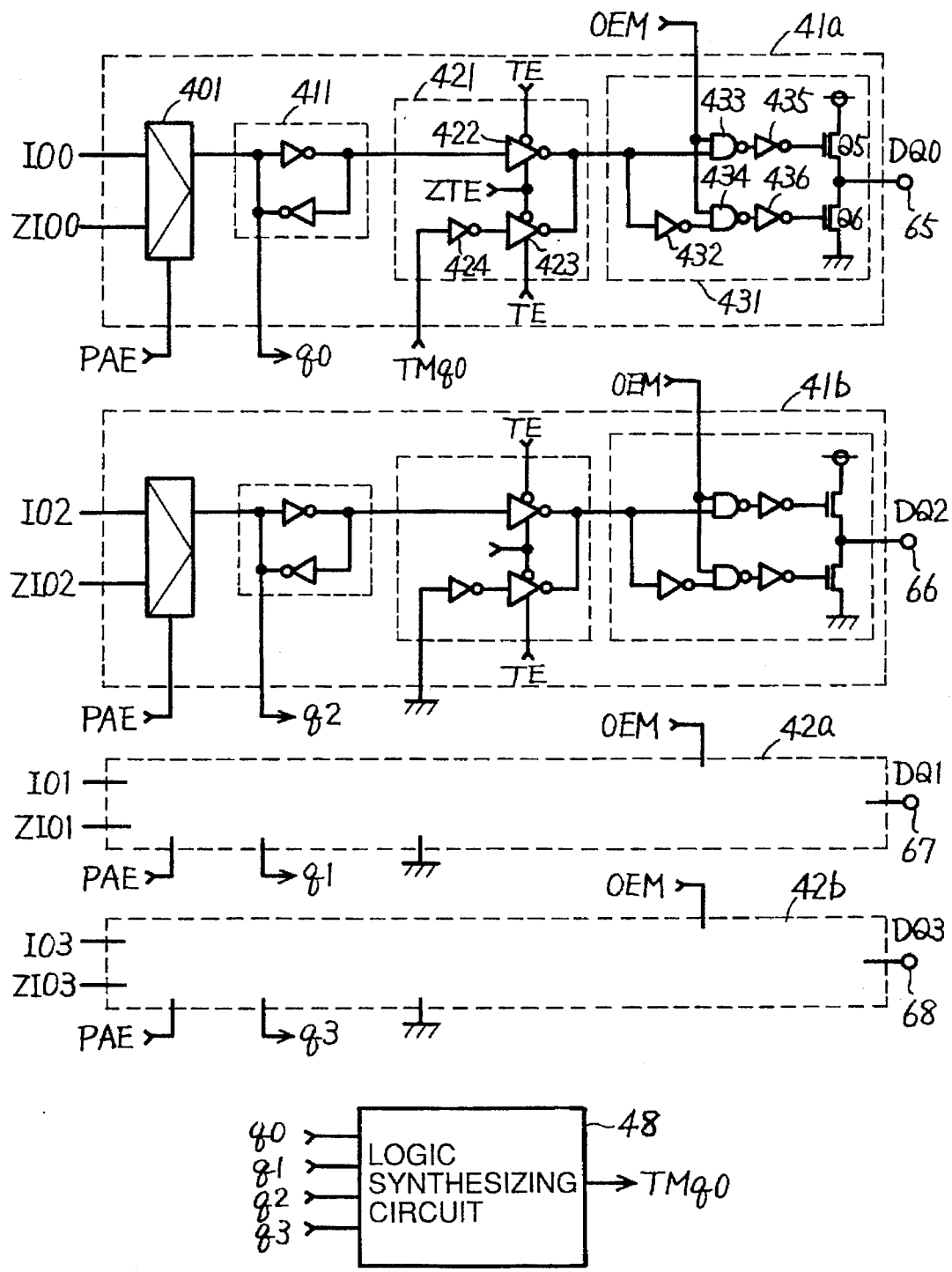
FIG. 7 is a circuit diagram showing a structure of an output buffer circuit in the semiconductor memory device according to the first embodiment of the present invention.

Referring to FIG. 7, output buffer circuits 41a, 41b, 42a, and 42b in semiconductor memory device 101 are included in input/output buffer circuits 18a, 18b, 19a, and 19b in FIG. 1.

Output buffer circuit 41a includes a preamplifier circuit 401 connected to internal data buses IO0 and ZIO0, a latch circuit 411 receiving the output of preamplifier circuit 401 to hold the data, a switch circuit 421 receiving the output of latch circuit 411 and output signal TMq0 of logic synthesizing circuit 48 to output any one of the output and the output signal in response to test mode specify signal TE, and an output control circuit 431 receiving the output of switch circuit 421 to output an external read signal DQ0 to external input/output terminal 65 in response to internal output enable signal OEM.

Preamplifier circuit 401 amplifies internal read signals IO0 and ZIO0 transmitted through internal data buses IO0 and ZIO0 in response to a preamplifier control signal PAE for output.

Latch circuit 411 includes inverter circuits 412 and 413 having their inputs and outputs connected to each other. The output of preamplifier circuit 401 is applied to inverter circuit 412 as well as logic synthesizing circuit 48.

Switch circuit 421 includes clocked inverter circuits 422 and 423 controlled by test mode specify signal TE and an inversion signal ZTE thereof. Clocked inverter circuit 422 receives the output of latch circuit 411, and when test mode specify signal TE is in the non-active state (L level state), clocked inverter circuit 422 is activated to output the inversion signal. On the other hand, clocked inverter circuit 423 receives the output of inverter circuit 424 receiving output signal TMq0 of logic synthesizing circuit 48. When test mode specify signal TE is in the active state, clocked inverter circuit 423 is activated to output the inversion signal.

Output control circuit 431 includes an inverter circuit 432, NAND circuits 433 and 434, inverter circuits 435 and 436, and N channel MOS transistors Q5 and Q6. NAND circuit 433 receives internal output enable signal OEM at one input and the outputs of clocked inverter circuits 422 and 423 at the other input. NAND circuit 434 receives internal output enable signal OEM at one input and the output of inverter circuit 432 at the other input which receives the output signals of clocked inverter circuits 422 and 423 and inverts the same for output. Inverter circuit 435 receives the output signals of NAND circuit 433, and inverter circuit 436 receives the output of NAND circuit 434. N channel MOS transistors Q5 and Q6 are connected in series between the power supply potential corresponding to the H level and the ground potential corresponding to the L level. The gates of N channel MOS transistors Q5 and Q6 are connected to the output nodes of inverter circuits 435 and 436, respectively. A connection point between N channel MOS transistors Q5 and Q6 and external input/output terminal 65 are connected.

Output buffer circuits 41b, 42a, and 42b are structured basically the same as output buffer circuit 41a. Output buffer circuits 41b, 42a, and 42b are different from output buffer circuit 41a in that in switch circuit 421, the output of latch circuit 411 is applied to clocked inverter circuit 422, and that a signal fixed at the L level instead of output signal TMq0 of logic synthesizing circuit 48 is applied to inverter circuit 424. As in output buffer circuit 41a, internal read signals q1 to q3 from latch circuit 411 are applied to logic synthesizing circuit 48.

Operation of output buffer circuits 41a, 41b, 42a, and 42b will briefly be described hereinafter.

In the normal operation mode, that is, when test mode specify signal TE is in the non-active state (L level state), a read signal transmitted through internal data buses IO0 and ZIO0 is amplified by preamplifier circuit 401 to be output as internal read signal q0. Since the test mode specify signal is in the non-active state, clocked inverter circuit 422 is active, and clocked inverter circuit 423 is non-active in the normal operation mode, an output signal from latch circuit 411 is inverted by clocked inverter circuit 422 to be provided to output control circuit 431.

In output control circuit 431, when internal output enable signal OEM is in the non-active state (L level state), the outputs of NAND circuits 433 and 434 are both at the H level irrespective of the output level of switch circuit 421, and N channel MOS transistors Q5 and Q6 having their gate potentials controlled by signals obtained by inverting these outputs by inverter circuits 435 and 436 are both brought to the non-conductive state. Therefore, external input/output terminal 65 is brought to the high impedance state.

On the other hand, in response to the active state (H level state) of internal output enable signal OEM, when internal read signal q0 is at the H level, for example, the output signal of switch circuit 421 obtained by inverting internal read signal q0 by latch circuit 411 and again inverting the signal by clocked inverter circuit 422 attains the H level. Therefore, the outputs of NAND circuits 433 and 434 attain the L level and the H level, respectively. Since the gate potential of N channel MOS transistor Q5 is controlled by an inversion signal of the output signal of NAND circuit 433, this transistor is rendered conductive. On the contrary, N channel MOS transistor Q6 is rendered non-conductive. Therefore, external input/output terminal 65 attains the H level, the potential according to the level of internal read signal q0.

The above operation applies to output buffer circuits 41b, 42a, and 42b.

On the other hand, in the test mode, the test mode specify signal is in the active state (H level state), and clocked inverter circuit 422 is non-active. Therefore, an output node of latch circuit 411 and output control circuit 431 are disconnected. On the other hand, since clocked inverter circuit 423 becomes active, a signal obtained by output signal TMq0 from logic synthesizing circuit 48 passing through inverter circuit 424 and clocked inverter circuit 423 is output from switch circuit 421.

Therefore, when the internal output enable signal is brought to the active state, output control circuit 431 is to change the potential of external input/output terminal 65 according to the level of output signal TMq0 from logic synthesizing circuit 48.

On the other hand, in output buffer circuits 41b, 42a, and 42b, since the input to inverter circuit 424 connected to an input node of active clocked inverter circuit 423 in switch circuit 421 is fixed at the L level, the potentials of external input/output terminals 66, 67, and 68 all attain the L level in response to the active state of internal output enable signal OEM.

Figure 8:
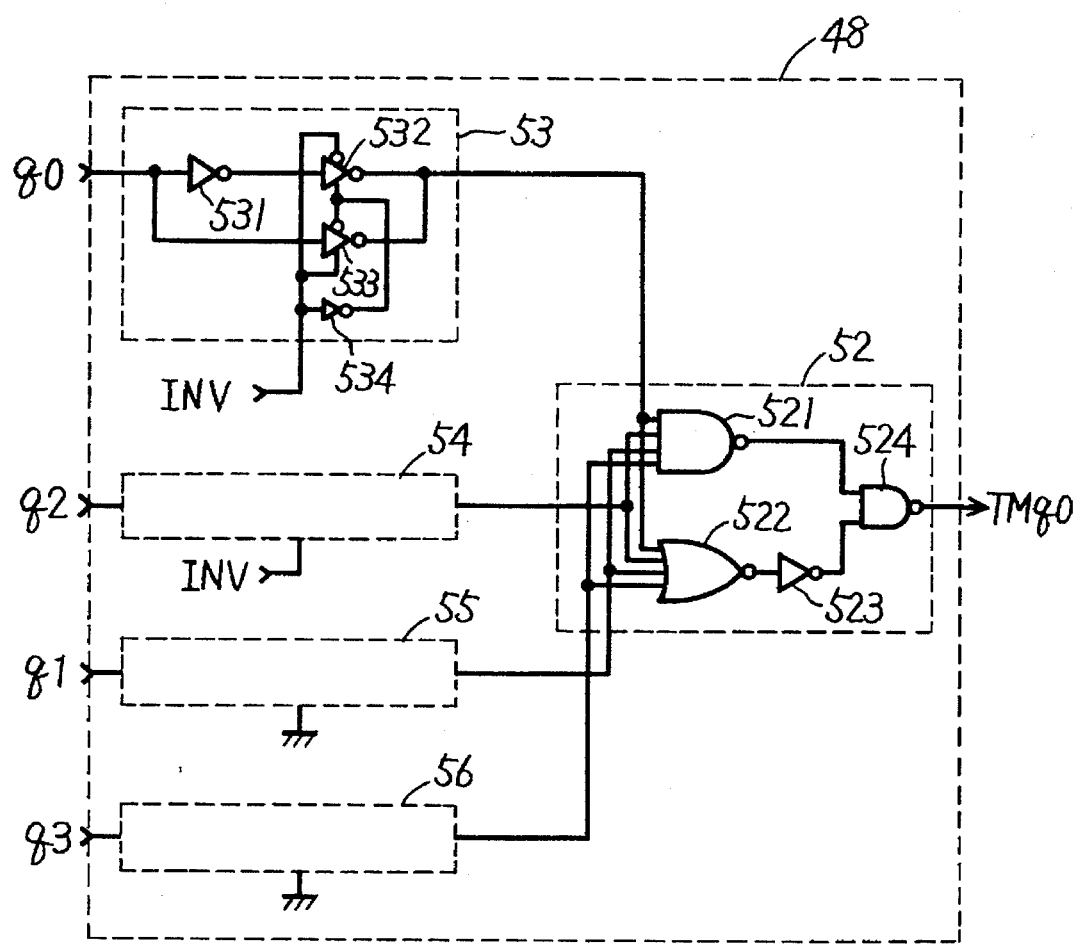
FIG. 8 is a circuit diagram showing a structure of a logic synthesizing circuit in the semiconductor memory device according to the first embodiment of the present invention.

Referring to FIG. 8, logic synthesizing circuit 48 includes inverting circuits 53 to 56 receiving internal read signals q0 to q3, respectively, and a comparing circuit 52 receiving output signals from inverting circuits 53 to 56 and carrying out a comparison operation to output determination signal TMq0.

Inverting circuit 53 includes an inverter circuit 531 receiving internal read signal q0, a clocked inverter circuit 532 receiving the output of inverter circuit 531 and controlled by inversion designate signal INV to be brought to the active state when signal INV is at the L level, a clocked inverter circuit 533 receiving internal read signal q0 and controlled by inversion designate signal INV to be brought to the active state when signal INV is at the H level, and an inverter circuit 534 receiving inversion designate signal INV to output a control signal to clocked inverter circuits 532 and 533.

Inverting circuit 54 is similar to inverting circuit 53 in structure except that it receives internal read signal q2.

Inverting circuit 55 is similar to inverting circuit 53 in structure except that it receives internal read signal q1, and that the potential of an input node receiving inversion designate signal INV is fixed at the L level.

Inverting circuit 56 is similar to inverting circuit 55 in structure except that it receives internal read signal q3.

Comparing circuit 52 includes an NAND circuit 521 receiving the outputs of inverting circuits 53 to 56, an NOR circuit 522 receiving the outputs of inverting circuits 53 to 56, an inverter circuit 523 receiving the output of NOR circuit 522, and an NAND circuit 524 receiving the output of NAND circuit 521 and the output of inverter circuit 523 to output determination signal TMq0.

Operation of logic synthesizing circuit 48 will briefly be described hereinafter with reference to FIG. 8.

When inversion designate signal INV is in the non-active state (L level state), clocked inverter circuit 532 is brought to the active state and clocked inverter circuit 533 is brought to the non-active state in inverting circuit 53. Therefore, a signal obtained by inverting internal read signal q0 by inverter circuit 531 and again inverting the signal by clocked inverter circuit 532, that is, a signal at the same level as internal read signal q0 is output. In the other inverting circuits 54 to 56, signals at the same levels as internal read signals q1 to q3 applied thereto are output.

NAND circuit 521 in comparing circuit 52 outputs the logical value 0, that is, a signal at the L level only when the signals from inverting circuits 53 to 56 are all at the logical value 1, that is, the H level. On the other hand, NOR circuit 522 outputs the logical value 1, that is, a signal at the H level only when the signals from inverting circuits 53 to 56 are all at the logical value 0, that is, the L level.

FIG. 9A is a diagram (truth table) describing operation of comparing circuit 52, taking the above into consideration, when inversion designate signal INV is at the L level.

When internal read signals q0 to q3 are all at the logical value 0, the output of NAND circuit 521 is at the logical value 1, the output of NOR circuit 522 is at the logical value 1, and the output of inverter circuit 523 is at the logical value 0. Therefore, the output of NAND circuit 524 receiving the output of NAND circuit 521 and the output of inverter circuit 523 is at the logical value 1, that is, the H level.

On the other hand, when internal read signals q0 to q3 are all at the logical value 1, the output of NAND circuit 521 is at the logical value 0, the output of NOR circuit 522 is at the logical value 0, and the output of inverter circuit 523 is at the logical value 1. Therefore, the output of NAND circuit 524 is at the logical value 1, that is, the H level.

When internal read signals q0 to q3 are not at the same logical value, the output of NAND circuit 521 is always at the logical value 1, the output of NOR circuit 522 is always at the logical value 0, and the output of inverter circuit 523 is at the logical value 1. Since NAND circuit 524 receives input data both at the logical value 1, the output of NAND circuit 524 is at the logical value 0, that is, the L level.

Operation of logic synthesizing circuit 48 when inversion designate signal INV is at the H level will now be described.

When inversion designate signal INV is at the H level, clocked inverter circuit 533 is brought to the active state and clocked inverter circuit 532 is brought to the non-active state in inverting circuit 53. Therefore, a signal obtained by inverting internal read signal q0 by clocked inverter circuit 533 is output from inverting circuit 53.

Similarly, a signal obtained by inversion of internal read signal q2 is output from inverting circuit 54. On the other hand, inverting circuits 55 and 56 directly output internal read signals q1 and q3.

FIG. 9B is a diagram (truth table) describing operation of comparing circuit 52 in this case.

As compared to the case where inversion designate signal INV is at the L level, signals obtained by inversion of internal read signals q0 and q2 are applied to comparing circuit 52. Therefore, by inverting logical values of internal read signals q0 and q2 in FIG. 9A, the same output signal TMq0 as in FIG. 9A is to be output in FIG. 9B.

More specifically, when (q0, q2, q1, q3)=(0, 0, 1, 1), (1, 1, 0, 0), inversion signal TMq0 is at the logical value 1, that is, the H level, and otherwise at the logical value 0, that is, the L level.

Based on the above described operation of logic synthesizing circuit 48, the reading operation of semiconductor memory device 101 according to the first embodiment of the present invention will now be described with reference to the drawings.

Referring to FIGS. 7, 9A, 9B, and 10, external row strobe signal EXT.RAS falls to the L level at time t0. After that, external column strobe signal EXT.CAS falls to the L level at time t1. At time t2, preamplifier control signal PAE becomes active (H level), and preamplifier circuit 401 amplifies the potentials of internal data buses IO0 to IO3 which are at the L level according to storage data stored in corresponding memory cells for output at time t3. Internal read signals q0 to q3 output from preamplifier circuit 401 are held in latch circuits 411 in output buffer circuits 41a, 41b, 42a, and 42b, respectively. In response to the L level of external column strobe signal EXT.CAS, internal output enable signal OEM is brought to the active state (H level) at time t4. In response to this internal output enable signal OEM, external read signals DQ0 to DQ3 are output from output control circuit 431 to external input/output terminals 65 to 68 at time t5.

Figure 11:
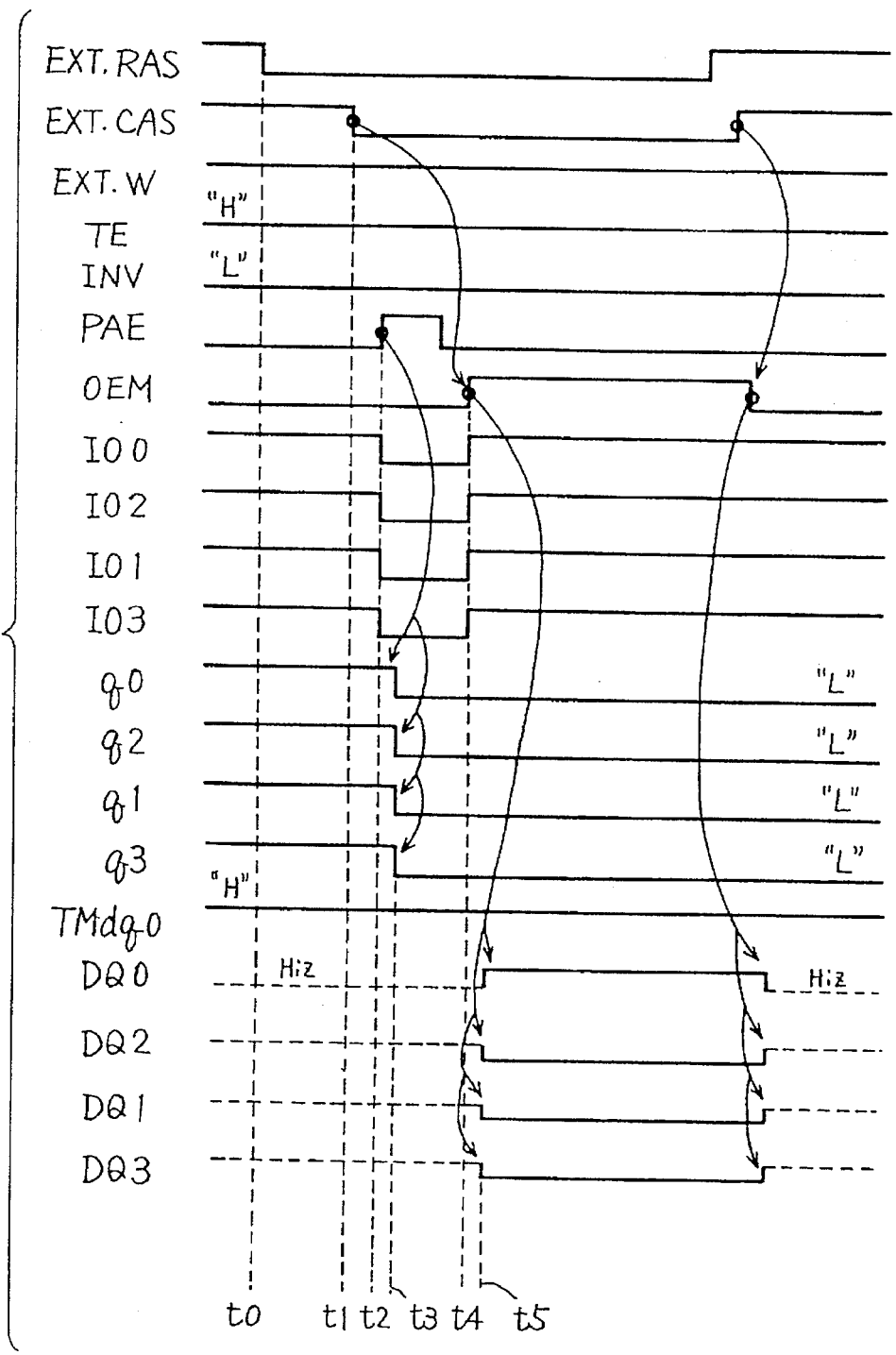
FIG. 11 is a first timing chart showing the reading operation in the test mode of the semiconductor memory device according to the first embodiment of the present invention.

FIG. 11 is a timing chart showing operation for reading out data in the multi-bit test operation mode.

In FIG. 11, it is assumed that inversion designate signal INV is in the non-active state (L level state), and that information at the L level is prestored in all memory cells in which reading is carried out.

Figure 10:
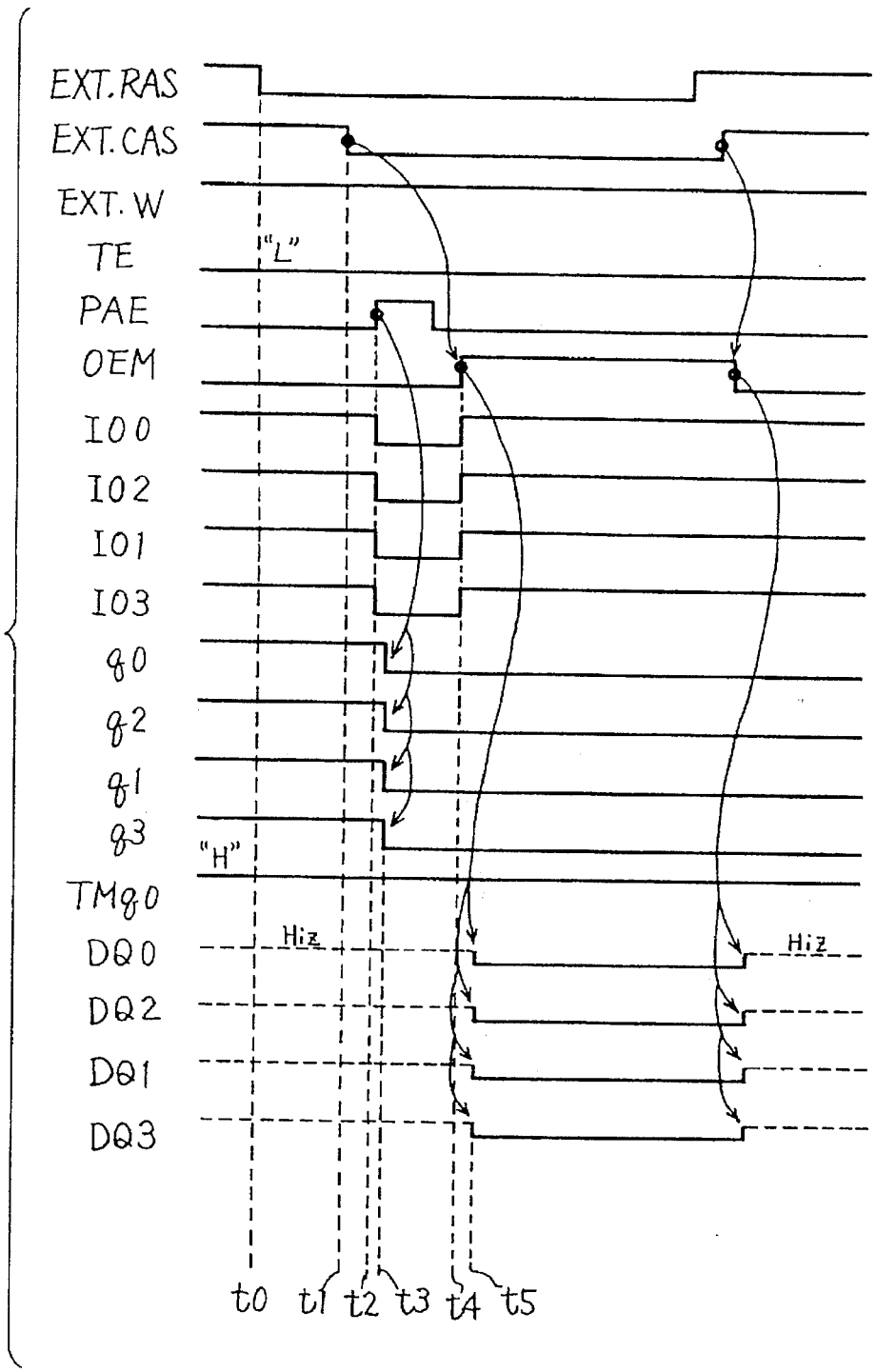
FIG. 10 is a timing chart showing reading operation in the normal operation mode of the semiconductor memory device according to the first embodiment of the present invention.

In this case, similarly to the case of FIG. 10, in response to preamplifier control signal PAE attaining the active state at time t2, the potentials of internal data buses IO0 to IO3 are amplified, and internal read signals q0 to q3 are output from preamplifier circuit 401 at time t3. Internal read signals q0 to q3 are held in respective latch circuits 411. Logic synthesizing circuit 48 receives internal read signals q0 to q3, and outputs determination signal TMq0 corresponding to the diagram shown in FIG. 9A. More specifically, when internal read signals q0 to q3 are at the logical value 0 corresponding to storage information prestored in corresponding memory cells, determination signal TMq0 at the logical value 1, that is, the H level is output.

On the other hand, when internal read signals q0 to q3 are different from the prestored storage information, that is, when at least one of internal read signals q0 to q3 corresponds to the logical value 1, inversion signal TMq0 is at the logical value 0, that is, the L level.

In the test mode, output buffer circuit 41a receives this inversion signal TMq0. In response to internal write enable signal OEM attaining the active state at time t4, output buffer circuit 41a outputs external read signal DQ0 corresponding to signal TMq0 to external input/output terminal 65.

On the other hand, the other output buffer circuits 41b, 42a, and 42b output external read signals DQ1 to DQ3 at the L level to external input/output terminals 66 to 68, respectively.

Therefore, when information is written and read out in the multi-bit test operation mode, data is written only through external input/output terminal 65. By monitoring data read out from external input/output terminal 65 in the reading operation, it can be determined whether or not the written data is correctly read out.

Figure 12:
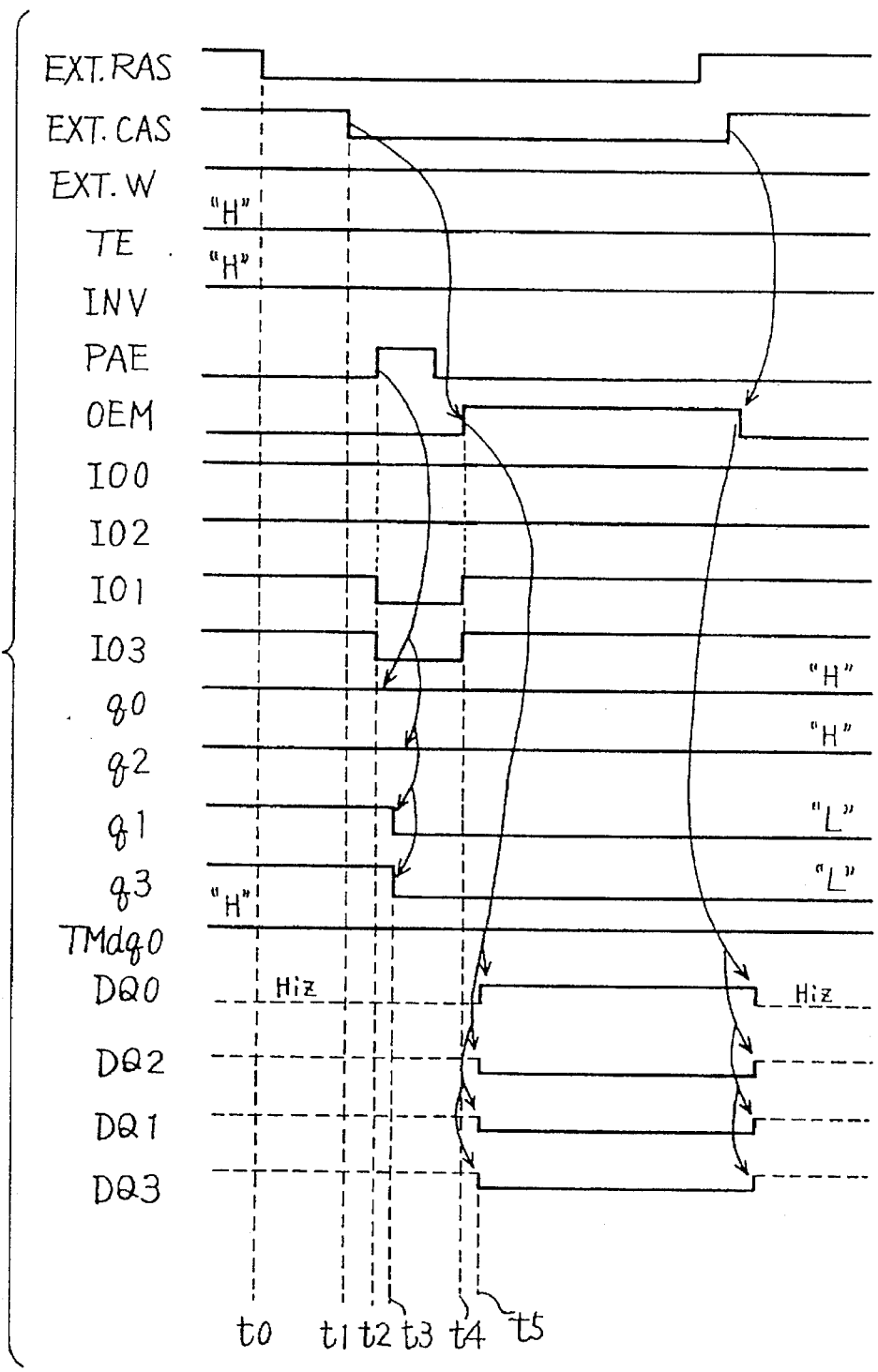
FIG. 12 is a second timing chart showing the reading operation in the test mode of the semiconductor memory device according to the first embodiment of the present invention.

FIG. 12 is a timing chart in the case where inversion designate signal INV is in the active state (H level state), and where storage data is read out in the multi-bit test operation mode.

Also in this case, it is assumed that data at the L level is input from external input/output terminal 65 in data writing.

However, as described with reference to FIG. 3, when inversion designate signal INV is in the active state, data at the inverted H level is to be written in memory cells corresponding to internal data buses IO0 and IO2.

Therefore, when the reading operation is carried out correctly, the read data must be (q0, q2, q1, q3)=(1, 1, 0, 0).

Similar to the case of FIG. 11, in response to preamplifier control signal PAE becoming active at time t2, data read out to internal data buses IO0 to IO3 are amplified by preamplifier 401, and output as internal read data q0 to q3 at time t3.

These internal read signals q0 to q3 are held in latch circuits 411.

Logic synthesizing circuit 48 receives internal read signals q0 to q3, and outputs determination signal TMq0 according to the diagram of FIG. 9B.

Therefore, when these internal read signals q0 to q3 are correctly read out with respect to the written data, determination signal TMq0 is at the logical value 1, that is, the H level.

On the other hand, when internal read signals q0 to q3 are not read out correctly, determination signal TMq0 is at the logical value 0, that is, the L level.

In response to internal output enable signal OEM becoming active at time t4, output buffer circuit 41a outputs external read signal DQ0 corresponding to inversion signal TMq0 to external input/output terminal 65 at time t5.

The other output buffer circuits 41b, 42a, and 42b output external read signals DQ1 to DQ3 at the L level to external input/output terminals 66 to 68, respectively.

Therefore, also in this case, when data is written and read out using the data bit compression function in the test mode, by inputting data only to external input/output terminal 65, and monitoring data read out from external input/output terminal 65, it is possible to determine whether or not the written data is read out correctly.

As described above, according to the first embodiment of the present invention, when the reading operation and the writing operation are carried out in the multi-bit test mode, the operation state can be tested by writing and reading data only through a specific external input/output terminal. Therefore, the number of semiconductor memory devices which can be tested simultaneously in parallel can be increased, whereby the test time can be shortened.

Further, by activating or non-activating the inversion designate signal, a voltage stress can be applied between every adjacent bit lines, whereby a latent defect between bit lines can be revealed in the burn-in test.

More specifically, according to the present embodiment, the test time required for the burn-in test or the like can be shortened, and the reliability of the test result can be improved.

Although semiconductor memory device 101 is in the x4 configuration in the above description, the configuration of input/output terminals is not limited thereto. In the case of a semiconductor memory device in an x16 configuration, for example, the semiconductor memory device can be tested as one in the x4 configuration apparently by treating every four bits as one .group when the reading operation and the writing operation are conducted in the multi-bit test mode.

[Second Embodiment]

In the first embodiment, when data is written in the multi-bit test mode, an external input/output terminal not used in the writing operation can receive write data as well as a specific input/output terminal used for data writing.

Therefore, when the potential level of the input/output terminal not used for data writing is brought to the intermediate potential, that is, the potential level between the H level and the L level by any means in the test operation mode, a so-called through current or the like might be generated in a CMOS circuit configuring the input buffer circuit, inducing malfunction and circuit failure.

The second embodiment is different from the first embodiment in that potential control circuits 71a, 71b, 72a, and 72b are connected between external input/output terminals 65 to 68 in FIG. 1 and input buffer circuits 31a, 31b, 32a, and 32b, respectively.

Further, in the second embodiment, control signal generating circuit 11 outputs two kinds of input control signals CASNW and CASNWTE in response to external column strobe signal EXT.CAS.

Figure 13:
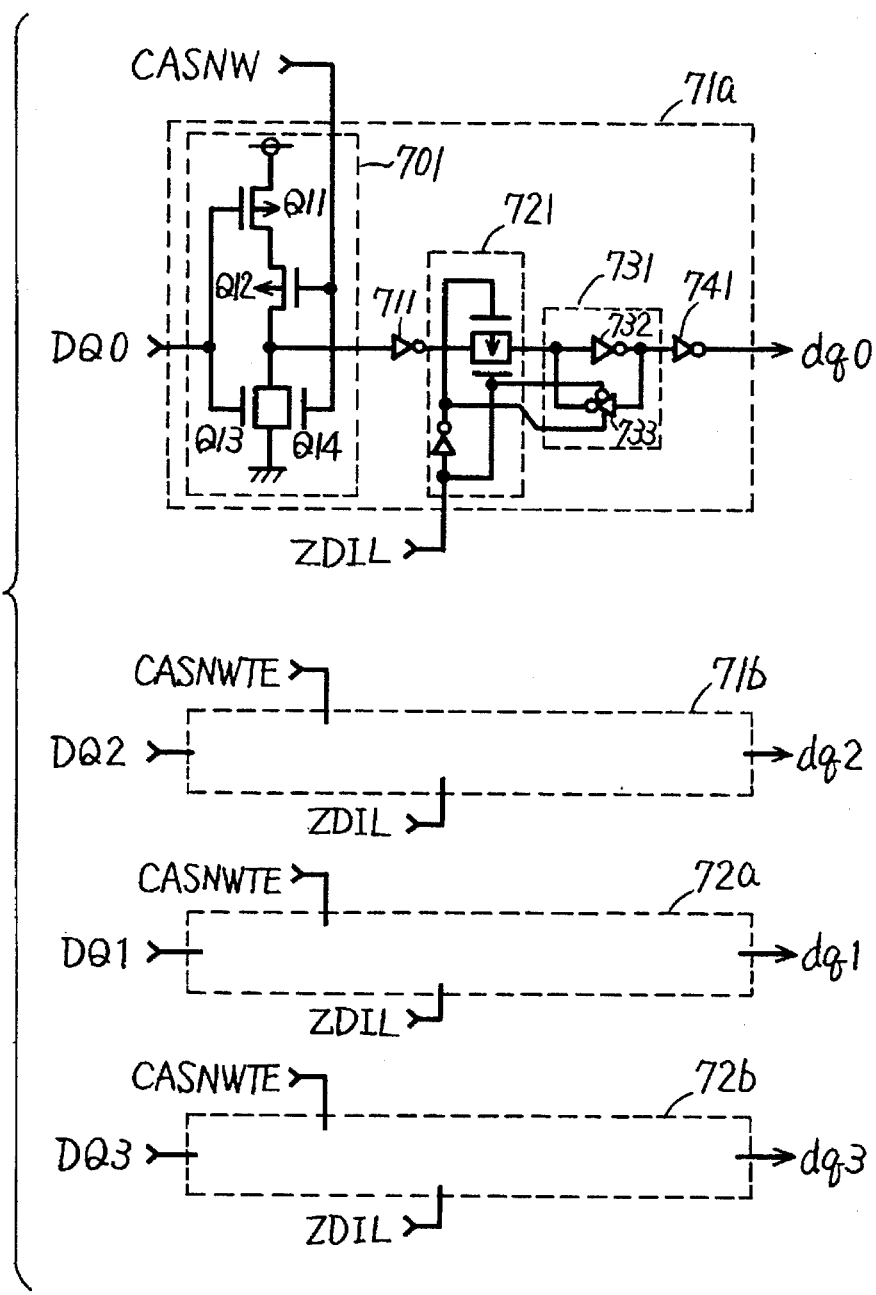
FIG. 13 is a circuit diagram showing a structure of an input potential control circuit in a semiconductor memory device according to a second embodiment of the present invention.

Referring to FIG. 13, input potential control circuit 71a includes an NOR circuit 701 receiving external write signal DQ0 and input control signal CASNW, an inverter circuit 711 receiving the output of NOR circuit 701, a transmission gate circuit 721 controlled by an internal control signal ZDIL, a latch circuit 731 controlled by internal control signal ZDIL, and an inverter circuit 741 receiving the output of latch circuit 731 to output internal write signal dq0.

NOR circuit 701 includes N channel MOS transistors Q13 and Q14 having their gates connected together to the ground potential corresponding to the L level, a P channel MOS transistor Q12 having its drain connected to the drains of transistors Q13 and Q14 together, and a P channel MOS transistor Q11 having its drain connected to the source of transistor Q12 and its source connected to the power supply potential corresponding to the H level. Transistors Q11 and Q13 receive external write signal DQ0 at their gates. Transistors Q12 and Q14 receive input control signal CASNW at their gates. The potential of the drain of P channel MOS transistor Q12 is applied to inverter circuit 711 as the output of NOR circuit 701.

When internal control signal CASNW is in the active state (L level state), NOR circuit 701 outputs a signal obtained by inversion of external write signal DQ0. When input control signal CASNW is in the non-active state (H level state), NOR circuit 701 always outputs a signal at the L level.

Transmission gate circuit 721 connects an output node of inverter circuit 711 receiving the output signal of NOR circuit 701 and an input node of latch circuit 731 when signal ZDIL is in the active state (H level state).

Latch circuit 731 includes an inverter circuit 732, and a clocked inverter circuit 733 having its input and output nodes interconnected to those of inverter circuit 732 and controlled by signal ZDIL. Since clocked inverter circuit 733 is brought to the active state when signal ZDIL is at the L level, latch circuit 731 is brought to the active state only when signal ZDIL is at the L level. The output of latch circuit 731 is inverted by inverter circuit 741 to be output as internal write signal dq0.

The other input potential control circuits 71b, 72a, and 72b are structured similarly to input potential control circuit 71a except that these circuits are controlled not by input control signal CASNW but by input control signal CASNWTE.

Figure 14:
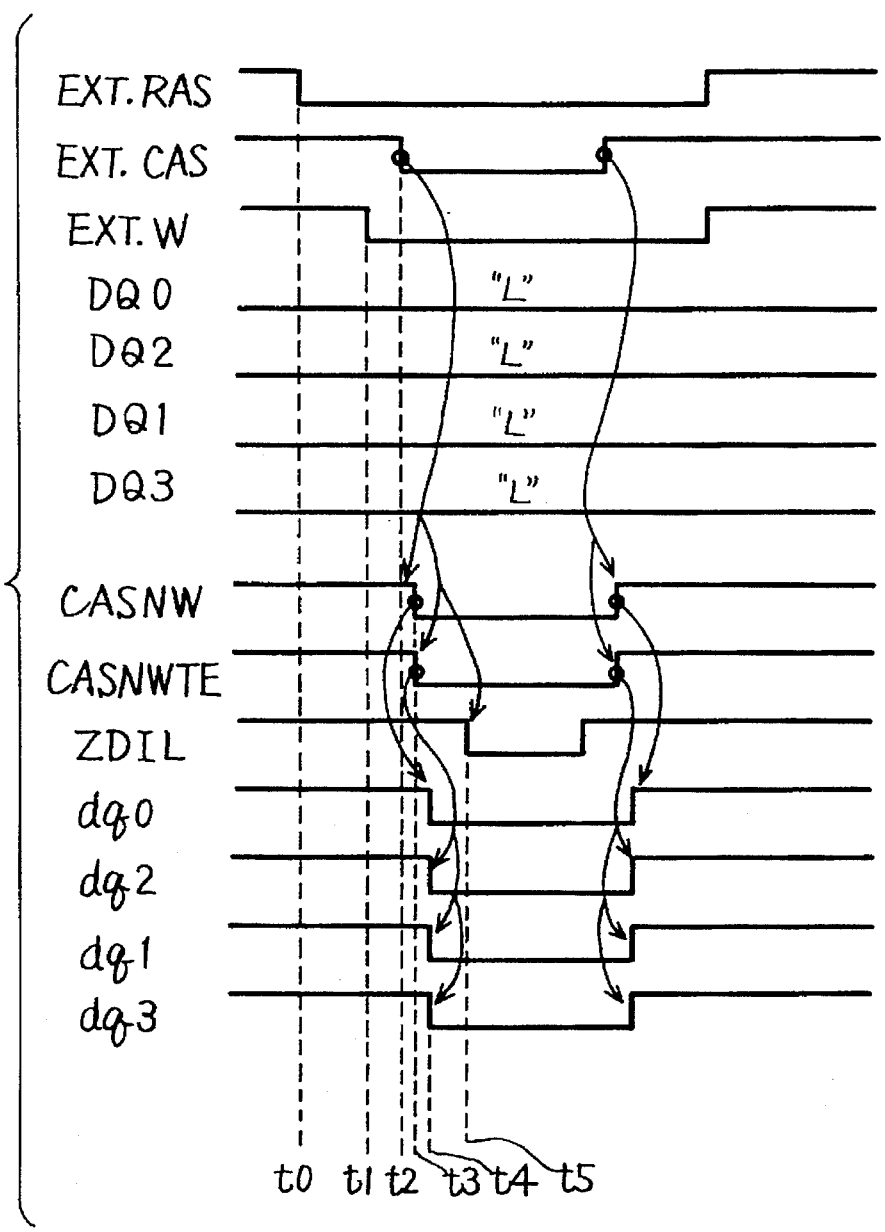
FIG. 14 is a timing chart showing operation in the normal operation mode of the input potential control circuit according to the second embodiment of the present invention.

Referring to FIG. 14, it is assumed that write data applied to external input/output terminals 65 to 68 are all at the L level.

In the normal operation mode, it is assumed that both input control signals CASNW and CASNWTE output from control signal generating circuit 11 change similarly.

Therefore, in response to falling of external column strobe signal EXT.CAS to the L level at time t2, input control signals CASNW and CASNWTE both fall to the L level at time t3. In response to falling of input control signals CASNW and CASNWTE to the L level at time t3, internal write signals dq0 to dq3 corresponding to external write signals DQ0 to DQ3 are output at time t4. In response to falling of control signal ZDIL to the L level with a predetermined time delay after falling of external column strobe signal EXT.CAS at time t5, internal write signals dq0 to dq3 corresponding to external write signals DQ0 to DQ3 are held by latch circuits 731.

Figure 15:
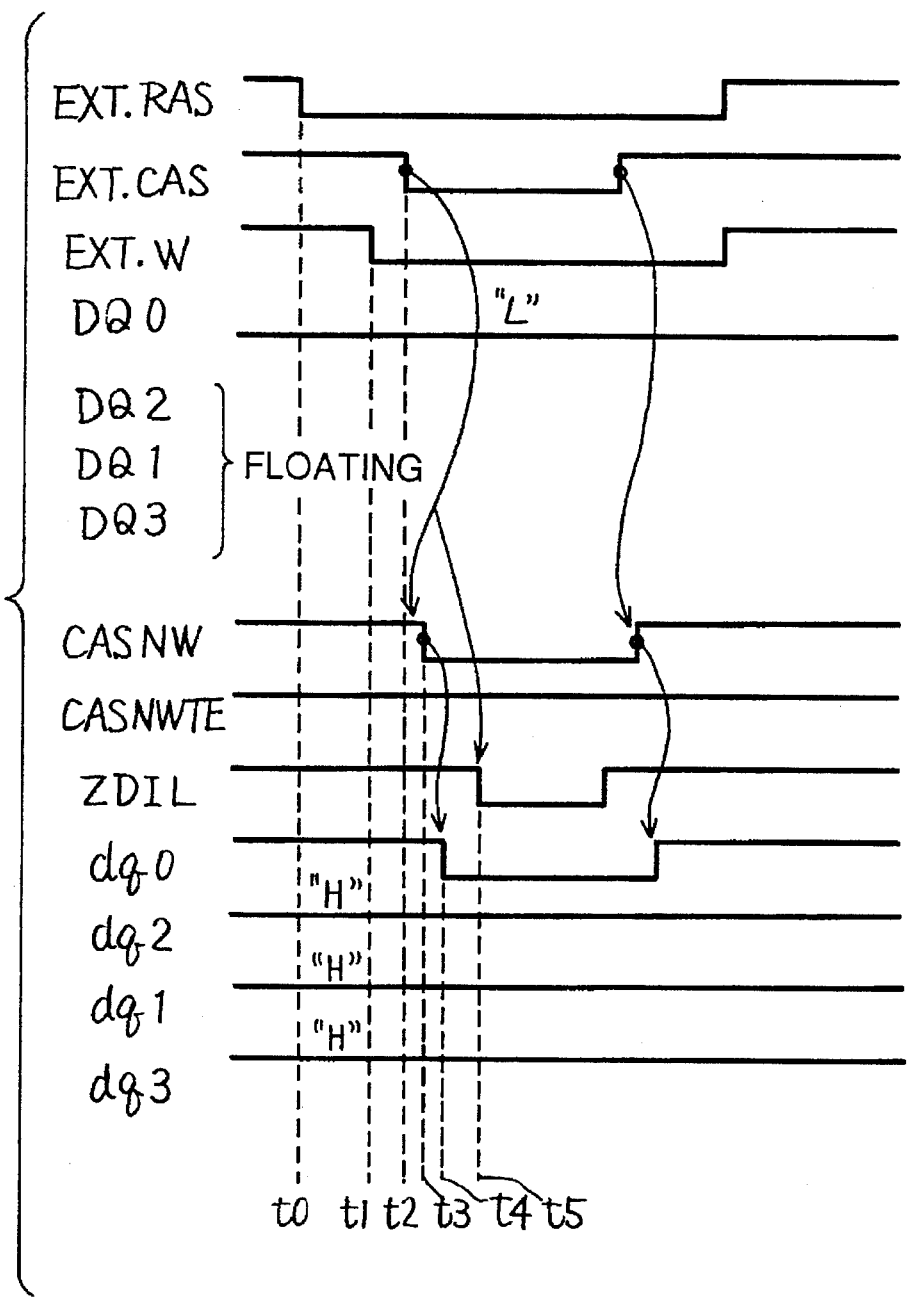
FIG. 15 is a timing chart showing operation in the test mode of the input potential control circuit according to the second embodiment of the present invention.

FIG. 15 is a timing chart describing operation of input potential control circuits 71a, 71b, 72a, and 72b when data is written in the multi-bit test mode.

The operation of FIG. 15 is different from the operation in the normal operation mode shown in FIG. 14 in that input control signal CASNWTE always maintains the non-active state (H level state) in the test mode.

Therefore, in this case, NOR circuits 701 in input potential control circuits 71b, 72a, and 72b controlled by signal CASNWTE are always to output a signal at the L level irrespective of the levels of external write signals DQ1 to DQ3.

More specifically, internal write signals dq1 to dq3 always maintain the H level.

On the other hand, in response to falling of input control signal CASNW to the L level at time t3, input potential control circuit 71a outputs internal write signal dq0 corresponding to external write signal DQ0 at time t4.

Therefore, in the test mode, even when external input/output terminals 66 to 68 not used for data writing are in an electrically floating state and at the intermediate potential, for example, this potential is not transmitted to internal circuitry. Therefore, a through current does not flow in a CMOS circuit configuring the input buffer circuit and malfunction does not occur.

[Third Embodiment]

In semiconductor memory device 101 according to the first embodiment, when data is written in the multi-bit test mode, a signal obtained by inversion of input data dq0 in response to inversion designate signal INV can be used as write signals to memory cells in which data is written through internal data buses IO0 and ZIO0 and IO2 and ZIO2.

The third embodiment is different from the first embodiment in that the data writing operation through internal data buses IO0 and ZIO0, and IO2 and ZIO2, and the data writing operation through internal data buses IO1 and ZIO1, and IO3 and ZIO3 are controlled by different internal write enable signals.

Figure 16:
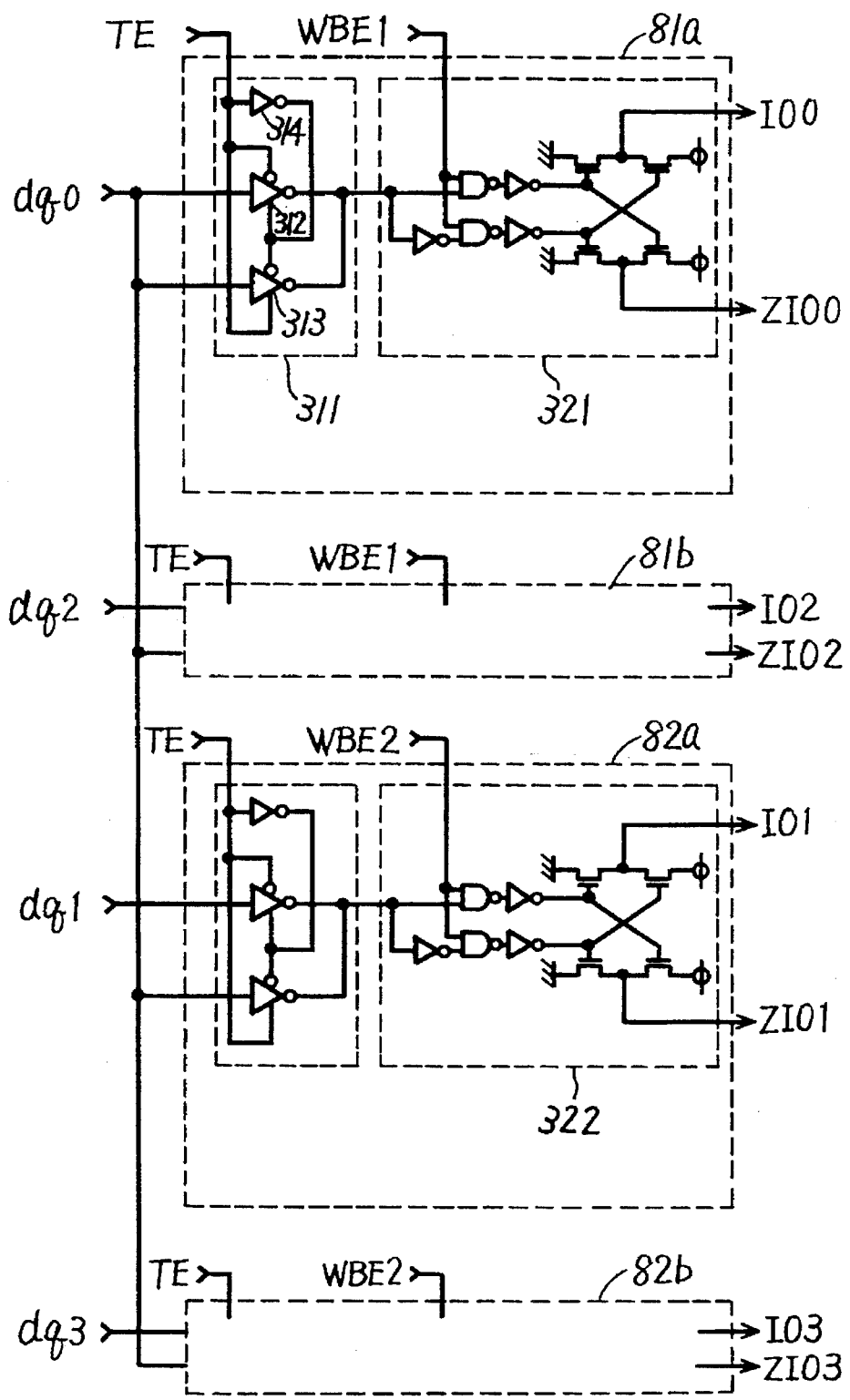
FIG. 16 is a circuit diagram showing a structure of an input buffer circuit of a semiconductor memory device according to a third embodiment of the present invention.

Referring to FIG. 16, an input buffer circuit 81a receives write data dq0, is controlled by an internal write enable signal WBE1, and outputs a corresponding complementary signal to internal data buses IO0 and ZIO0. Input buffer circuit 81a includes switch circuit 311 and input control circuit 321.

Switch circuit 311 includes clocked inverter circuits 312 and 313, and inverter circuit 314. This switch circuit 311 is structured similarly to that in the first embodiment except that clocked inverter circuits 312 and 313 both receive internal write signal dq0. Input control circuit 321 is structured similarly to that in the first embodiment except that it is controlled by internal write enable signal WBE1.

More specifically, when test mode specify signal TE is in the non-active state (L level state), clocked inverter circuit 312 becomes active, and when signal TE is in the active state (H level state), clocked inverter circuit 313 is brought to the active state. These clocked inverter circuits 312 and 313 invert write signal dq0 for output.

In response to internal write enable signal WBE1 attaining the active state (H level state), input control circuit 321 brings internal data buses IO0 and ZIO0 to complementary potential levels corresponding to write signal dq0.

An input buffer circuit 82b is also controlled by internal write enable signal WBE1. Input buffer circuit 82b has the same structure as input buffer circuit 81a except that input buffer circuit 82b outputs to internal data buses IO2 and ZIO2 complementary signals corresponding to write signal dq2 and write signal dq0 when the test mode specify signal is in the non-active state and in the active state, respectively.

An input buffer circuit 82a is controlled by an internal write enable signal WBE2. Input buffer circuit 82a has the same structure as input buffer circuit 81a except that input buffer circuit 82a outputs to internal data buses IO1 and ZIO1 signals corresponding to signals dq1 and dq0 when test mode specify signal TE is in the non-active state and in the active state, respectively.

An input buffer circuit 82b has the same structure as input buffer circuit 82a except that input signals dq3 and dq0 are switched in response to signal TE, and that signals corresponding to these signals are output to internal data buses IO3 and ZIO3.

Figure 17:
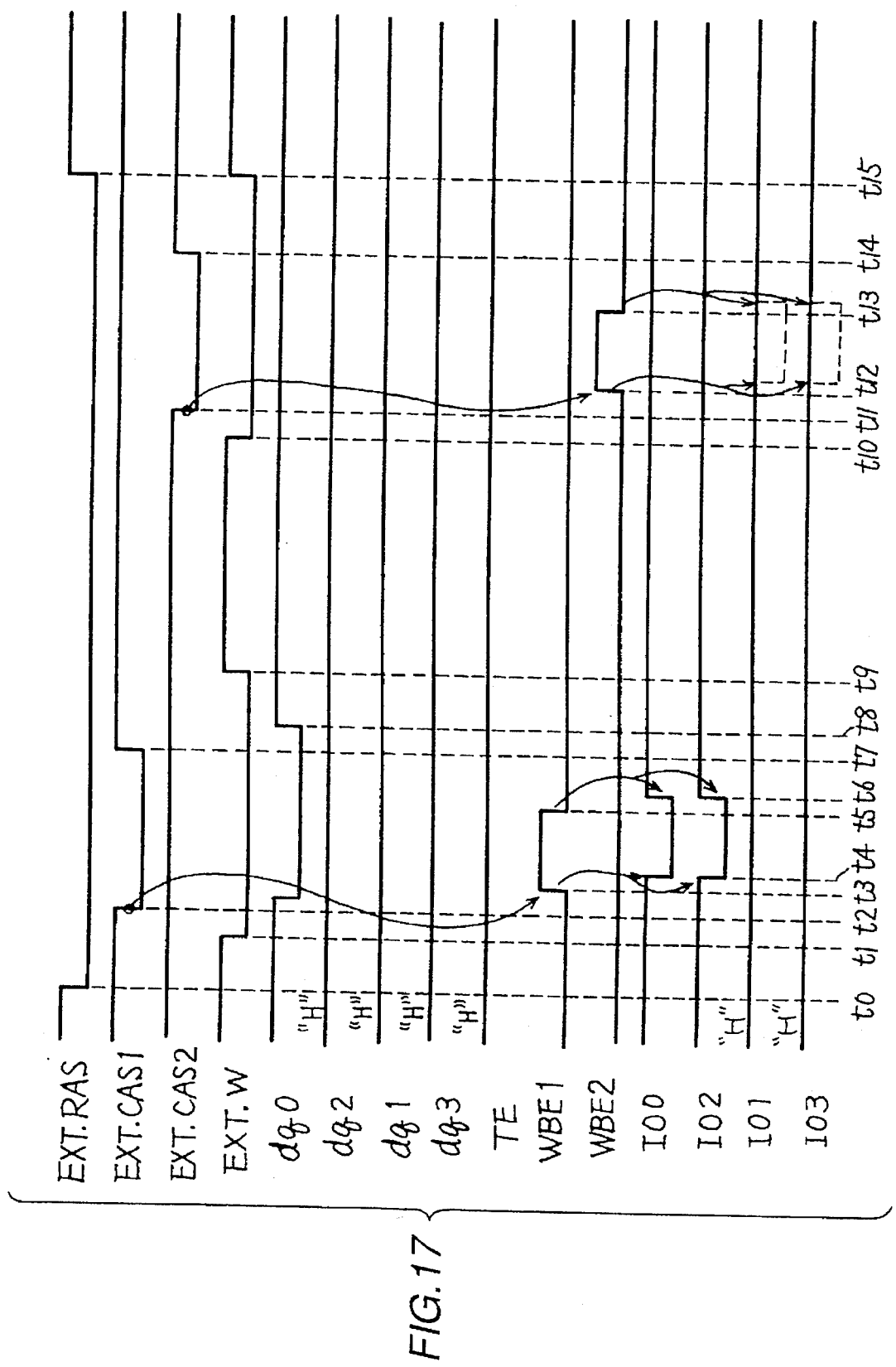
FIG. 17 is a timing chart showing operation of the semiconductor memory device according to the third embodiment of the present invention.
Figure 18:
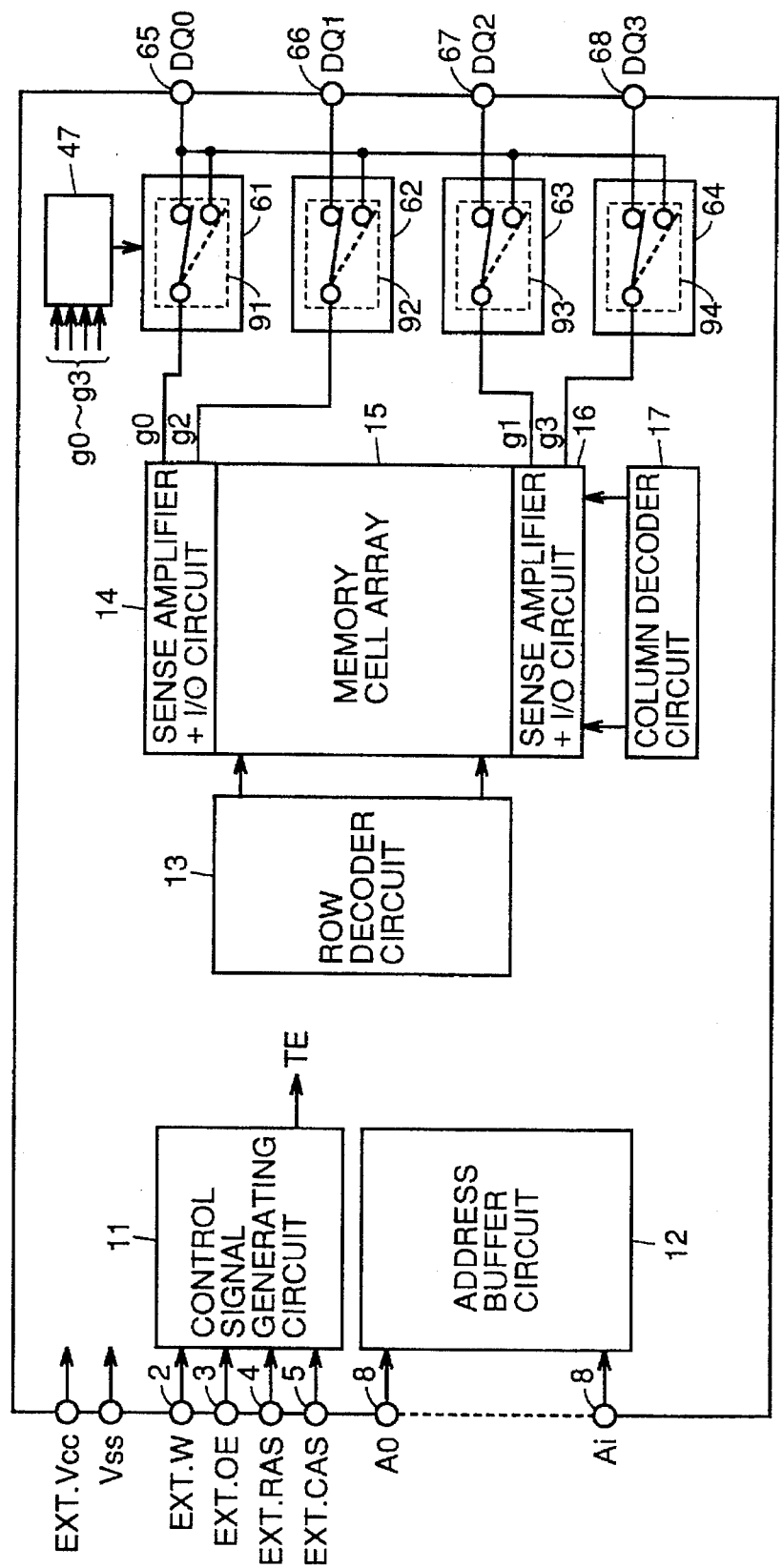
FIG. 18 is a schematic block diagram showing a structure of a semiconductor memory device capable of a multi-bit test operation.

FIG. 17 is a timing chart showing operation in the test mode according to the third embodiment of the present invention.

Unlike the case of the first embodiment, control signal generating circuit 11 receives a first external column strobe signal EXT.CAS1 to output internal write enable signal WBE1 in response thereto, and receives a second external column strobe signal EXT.CAS2 to output second internal write enable signal WBE2 in response thereto.

In the following description, it is assumed that data at the L level is written in memory cells in which data is written through internal data buses IO0 and ZIO, and IO2 and ZIO2, and that data at the H level is written in memory cells in which data is written through internal data buses IO1 and ZIO1, and IO3 and ZIO3.

At time t0, external row strobe signal EXT.RAS falls to the L level. After that, first column strobe signal EXT.CAS1 falls to the L level at time t2. In response to this, at time t3, first internal write enable signal WBE1 is brought to the active state (H level) to drive input buffer circuits 81a and 81b. According to the level of write signal dq0 applied to external input/output terminal 65, the potentials of internal data buses IO0 and IO2 attain the L level at time t4, whereby data is written in corresponding memory cells.

In response to falling of second column strobe signal EXT.CAS2 to the L level at time t11, second internal write enable signal WBE2 is brought to the active state (H level) at time t12. In response to this, input buffer circuits 82a and 82b are driven. According to the level of write signal dq0 applied to external input/output terminal 65, the potentials of internal data buses IO1 and ZIO1, and IO3 and ZIO3 attain the H level, whereby data is written in corresponding memory cells.

Because of the above operation, the potential arrangement in a group of the bit line pairs connected to internal data buses IO0 and ZIO0, and IO2 and ZIO2 and the potential arrangement in a group of the bit line pairs connected to internal data buses IO1 and ZIO1, and IO3 and ZIO3 can be changed independently. Even if data is written in the multi-bit test mode, a voltage stress can be applied between every adjacent bit lines.

Therefore, as in the first embodiment, the test time required for the burn-in test or the like can be shortened, and the reliability of the test result can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a plurality of word lines;
a plurality of bit line pairs crossing said plurality of word lines and divided into first and second groups;
a plurality of memory cells connected to said word lines and said bit line pairs and arranged in rows and columns;
memory cell selecting means responsive to an external address signal for carrying out a reading/writing operation of storage data from/to a corresponding memory cell; and
a plurality of input buffer means receiving a plurality of external input data in parallel, respectively, for outputting the data to said memory cell selecting means,
said plurality of input buffer means being divided into first and second groups corresponding to said first and second groups of said bit line pairs,
each of said plurality of input buffer means belonging to said first and second groups including
first switching means responsive to an externally applied operation mode specify signal for switching between a first state in which each input buffer means receives corresponding one of said plurality of input data and a second state in which each input buffer means receives the same input data as that to a predetermined input buffer means of said plurality of input buffer means,
each of the input buffer means belonging to said first group further including
first inverting means responsive to an externally applied inversion designate signal for inverting said input data when the input buffer means is in said second state.

2. The semiconductor memory device according to claim 1, further comprising:
a plurality of output buffer means provided corresponding to said plurality of input buffer means for receiving storage data read out by said memory cell selecting means to externally output the data; and
logical operation means receiving said storage data to be output from said plurality of output buffer means for carrying out a logical operation to output a determination signal, said logical operation means activating said determination signal when said read storage data matches written storage data, said output buffer means corresponding to said predetermined input buffer means including second switching means responsive to said operation mode specify signal for switching between a state in which said storage data is output and a state in which said determination signal is output.

3. The semiconductor memory device according to claim 2, wherein said logical operation means includes second inverting means receiving said storage data read out from the memory cells connected to the bit line pairs belonging to said first group and responsive to said externally applied inversion designate signal for inverting said storage data for output, and comparison operation means receiving said storage data read out from the memory cells connected to the bit line pairs belonging to said second group and output data of said second inverting means for carrying out comparison, said comparison operation means outputting active said determination signal when all input data are equal.

4. The semiconductor memory device according to claim 1, wherein said memory cell selecting means includes a plurality of sensing and amplifying means corresponding to said bit line pairs for sensing and amplifying potential differences of said bit line pairs, said sensing and amplifying means corresponding to the bit line pairs belonging to said first group and said sensing and amplifying means corresponding to the bit line pairs belonging to said second group are arranged on both ends with said bit line pairs therebetween, and bit lines belonging to said first group and bit lines belonging to said second group are arranged alternately.

5. The semiconductor memory device according to claim 1, further comprising:

a plurality of input terminals for receiving said plurality of input data, respectively;

a plurality of input potential control means connected between said input terminals and said input buffer means; and control signal generating means responsive to a third external control signal and said operation mode specify signal for outputting first and second internal input control signals, wherein said control signal generating means is responsive to said operation mode specify signal for outputting, when said input buffer means is in said first state, said first and second internal input control signals corresponding to said third external control signal, said control signal generating means is responsive to said operation mode specify signal for outputting, when said input buffer means is in said second state, said first internal input control signal corresponding to said third external control signal and non-active said second internal input control signal, the input potential control means connected to said predetermined input buffer means is controlled by said first internal input control signal for outputting a potential corresponding to said input data, and the input potential control means connected to the other said input buffer means is controlled by said second internal input control signal for outputting the potential corresponding to said input data.

6. A semiconductor memory device, comprising:

a plurality of word lines;

a plurality of bit line pairs crossing said plurality of word lines and divided into first and second groups;

a plurality of memory cells connected to said word lines and said bit line pairs and arranged in rows and columns;

memory cell selecting means responsive to an external address signal for carrying out a reading/writing operation of storage data from/to a corresponding memory cell; and a plurality of input buffer means divided into a plurality of groups for receiving a plurality of external input data in parallel, respectively, to output the data to said memory cell selecting means, each group of said input buffer means being divided into first and second subgroups corresponding to said first and second groups of said bit line pairs, each of said plurality of input buffer means belonging to said first and second subgroups including first switching means responsive to an externally applied operation mode specify signal for switching between a first state in which each input buffer means receives corresponding one of said plurality of input data and a second state in which each input buffer means receives the same input data as that to a predetermined input buffer means in each group of said input buffer means, each of the input buffer means belonging to said first subgroup further including first inverting means responsive to an externally applied inversion designate signal for inverting said input data when the input buffer means is in said second state.

7. The semiconductor memory device according to claim 6, further comprising:

a plurality of output buffer means provided corresponding to said plurality of input buffer means for receiving storage data read out by said memory cell selecting means to externally output the data; and a plurality of logical operation means each receiving said storage data to be output by said output buffer means corresponding to the group of said input buffer means for carrying out a logical operation to output a determination signal, each of said plurality of logical operation means activating said determination signal when said read storage data matches written storage data, said output buffer means corresponding to said predetermined input buffer means including second switching means responsive to said operation mode specify signal for switching between a state in which said storage data is output and a state in which said determination signal is output.

8. The semiconductor memory device according to claim 7, wherein each of said logical operation means includes second inverting means receiving said storage data read out from the memory cells connected to the bit line pairs belonging to said first group and responsive to said externally applied inversion designate signal for inverting said storage data for output, and comparison operation means receiving said storage data read out from the memory cells connected to the bit line pairs belonging to said second group and output data of said second inverting means for carrying out comparison, said comparison operation means outputting active said determination signal when all input data are equal.

9. The semiconductor memory device according to claim 6, wherein said memory cell selecting means includes a plurality of sensing and amplifying means corresponding to said bit line pairs for sensing and amplifying potential differences of said bit line pairs, said sensing and amplifying means corresponding to the bit line pairs belonging to said first group and said sensing and amplifying means corresponding to the bit line pairs belonging to said second group are arranged on both ends with said bit line pairs therebetween, and bit lines belonging to said first group and bit lines belonging to said second group are arranged alternately.

10. The semiconductor memory device according to claim 6, further comprising:

a plurality of input terminals for receiving said plurality of input data, respectively;

a plurality of input potential control means connected between said input terminals and said input buffer means; and control signal generating means responsive to a third external control signal and said operation mode specify signal for outputting first and second internal input control signals, wherein said control signal generating means is responsive to said operation mode specify signal for outputting, when said input buffer means is in said first state, said first and second internal input control signals corresponding to said third external control signal, said control signal generating means is responsive to said operation mode specify signal for outputting, when said input buffer means is in said second state, said first internal input control signal corresponding to said third external control signal and non-active said internal input control signal, the input potential control means connected to said predetermined input buffer means is controlled by said first internal input control signal for outputting a potential corresponding to said input data, and the input potential control means connected to the other said input buffer means is controlled by said second internal input control signal for outputting the potential corresponding to said input data.

11. A semiconductor memory device, comprising:

a plurality of word lines;

a plurality of bit line pairs crossing said plurality of word lines and divided into first and second groups;

a plurality of memory cells connected to said word lines and said bit line pairs and arranged in rows and columns;

memory cell selecting means responsive to an external address signal for carrying out a reading/writing operation of storage data from/to a corresponding memory cell; and a plurality of input buffer means receiving a plurality of external input data in parallel, respectively, for outputting the data to said memory cell selecting means, said input buffer means being divided into first and second groups corresponding to said first and second groups of said bit line pairs, each of said plurality of input buffer means belonging to said first and second groups including first switching means responsive to an externally applied operation mode specify signal for switching between a first state in which each input buffer means receives one of said plurality of input data and a second state in which each input buffer means receives the same input data as that to a predetermined input buffer means of said plurality of input buffer means, each of the input buffer means belonging to said first group including first input control means responsive to a first external control signal for controlling output of said input data to said memory cell selecting means, and each of the input buffer means belonging to said second group including second input control means responsive to a second external control signal for controlling output of said input data to said memory cell selecting means.

12. The semiconductor memory device according to claim 11, further comprising:

a plurality of output buffer means provided corresponding to said plurality of input buffer means for receiving said storage data read out by said memory cell selecting means to externally output the data; and logical operation means receiving said storage data to be output by said plurality of output buffer means for carrying out a logical operation to output a determination signal, said logical operation means activating said determination signal when said read storage data matches written storage data, said output buffer means corresponding to said predetermined input buffer means including second switching means responsive to said operation mode specify signal for switching between a state in which said storage data is output and a state in which said determination signal is output.

13. The semiconductor memory device according to claim 12, wherein said logical operation means includes second inverting means receiving said storage data read out from the memory cells connected to the bit line pairs belonging to said first group and responsive to said externally applied inversion designate signal for inverting said storage data for output, and comparison operation means receiving said storage data read out from the memory cells connected to the bit line pairs belonging to said second group and output data of said second inverting means for carrying out comparison, said comparison operation means outputting active said determination signal when all input data are equal.

14. The semiconductor memory device according to claim 11, wherein said memory cell selecting means includes a plurality of sensing and amplifying means corresponding to said bit line pairs for sensing and amplifying potential differences of said bit line pairs, said sensing and amplifying means corresponding to the bit line pairs belonging to said first group and said sensing and amplifying means corresponding to the bit line pairs belonging to said second group are arranged on both ends with said bit line pairs therebetween, and bit lines belonging to said first group and bit lines belonging to said second group are arranged alternately.

15. The semiconductor memory device according to claim 11, further comprising:

a plurality of input terminals for receiving said plurality of input data, respectively;

a plurality of input potential control means connected between said input terminals and said input buffer means; and control signal generating means responsive to a third external control signal and said operation mode specify signal for outputting first and second internal input control signals, wherein said control signal generating means is responsive to said operation mode specify signal for outputting, when said input buffer means is in said first state, said first and second internal input control signals corresponding to said third external control signal, said control signal generating means is responsive to said operation mode specify signal for outputting, when said input buffer means is in said second state, said first internal input control signal corresponding to said third external control signal and non-active said second internal input control signal, the input potential control means connected to said predetermined input buffer means is controlled by said first internal input control signal for outputting a potential corresponding to said input data, and the input potential control means connected to the other said input buffer means is controlled by said second internal input control signal for outputting the potential corresponding to said input data.

16. A semiconductor memory device, comprising:

a plurality of word lines;

a plurality of bit line pairs crossing said plurality of word lines and divided into first and second groups;

a plurality of memory cells connected to said word lines and said bit line pairs and arranged in rows and columns;

memory cell selecting means responsive to an external address signal for carrying out a reading/writing operation of storage data from/to a corresponding memory cell; and a plurality of input buffer means divided into a plurality of groups for receiving a plurality of external input data in parallel, respectively, to output the data to said memory cell selecting means, each group of said input buffer means being divided into first and second subgroups corresponding to said first and second groups of said bit line pairs, each of said plurality of input buffer means belonging to said first and second subgroups including first switching means responsive to an externally applied operation mode specify signal for switching between a first state in which each input buffer means receives corresponding one of said plurality of input data and a second state in which each input buffer means receives the same input data as that to a predetermined input buffer means in each group of said input buffer means, each of the input buffer means belonging to said first subgroup including first input control means responsive to a first external control signal for controlling output of said input data to said memory cell selecting means, and each of the input buffer means belonging to said second subgroup including second input control means responsive to a second external control signal for controlling output of said input data to said memory cell selecting means.

17. The semiconductor memory device according to claim 16, further comprising:

a plurality of output buffer means provided corresponding to said plurality of input buffer means for receiving said storage data read out by said memory cell selecting means to externally output the data, and a plurality of logical operation means each receiving said storage data to be output by said output buffer means corresponding to the group of said input buffer means for carrying out a logical operation to output a determination signal, each of said logical operation means activating said determination signal when said read storage data matches written storage data, and said output buffer means corresponding to said predetermined input buffer means including second switching means responsive to said operation mode specify signal for switching between a state in which said storage data is output and a state in which said determination signal is output.

18. The semiconductor memory device according to claim 17, wherein each of said logical operation means includes second inverting means receiving said storage data read out from the memory cells connected to the bit line pairs belonging to said first group and responsive to said externally applied inversion designate signal for inverting said storage data for output, and comparison operation means receiving said storage data read out from the memory cells connected to the bit line pairs belonging to said second group and output data of said second inverting means for carrying out comparison, said comparison operation means outputting active said determination signal when all input data are equal.

19. The semiconductor memory device according to claim 17, wherein said memory cell selecting means includes a plurality of sensing and amplifying means corresponding to said bit line pairs for sensing and amplifying potential differences of said bit line pairs, said sensing and amplifying means corresponding to the bit line pairs belonging to said first group and said sensing and amplifying means corresponding to the bit line pairs corresponding to said second group are arranged on both ends with said bit line pairs therebetween, and bit lines belonging to said first group and bit lines belonging to said second group are arranged alternately.

20. The semiconductor memory device according to claim 17, further comprising:

a plurality of input terminals for receiving said plurality of input data, respectively;

a plurality of input potential control means connected between said input terminals and said input buffer means; and control signal generating means responsive to a third external control signal and said operation mode specify signal for outputting first and second internal input control signals, wherein said control signal generating means is responsive to said operation mode specify signal for outputting, when said input buffer means is in said first state, said first and second internal input control signals corresponding to said third external control signal, said control signal generating means is responsive to said operation mode specify signal for outputting, when said input buffer means is in said second state, said first internal input control signal corresponding to said third external control signal and non-active said second internal input control signal, the input potential control means connected to said predetermined input buffer means is controlled by said first internal input control signal for outputting a potential corresponding to said input data, and the input potential control means connected to the other said input buffer means is controlled by said second internal input control signal for outputting the potential corresponding to said input data.

* * * * *